(12) United States Patent
Zhang et al.

(10) Patent No.: US 12,183,535 B2
(45) Date of Patent: Dec. 31, 2024

(54) DIELECTRIC COATED PLASMONIC PHOTOEMITTER

(71) Applicant: BOARD OF TRUSTEES OF MICHIGAN STATE UNIVERSITY, East Lansing, MI (US)

(72) Inventors: Peng Zhang, Okemos, MI (US); Lin Wu, Jadescape (SG); Xiao Xiong, The Tennery (SG); Yang Zhou, Lansing, MI (US)

(73) Assignees: Board of Trustees of Michigan State University, East Lansing, MI (US); **A*STAR**, Singapore (SG)

( * ) Notice: Subject to any disclaimer, the term of this patent is extended or adjusted under 35 U.S.C. 154(b) by 454 days.

(21) Appl. No.: 17/749,360

(22) Filed: May 20, 2022

(65) Prior Publication Data

US 2023/0103140 A1    Mar. 30, 2023

Related U.S. Application Data

(60) Provisional application No. 63/190,886, filed on May 20, 2021.

(51) Int. Cl.
| | |
|---|---|
| *H01J 1/34* | (2006.01) |
| *H01J 23/04* | (2006.01) |
| *H01J 25/34* | (2006.01) |
| *H01J 37/073* | (2006.01) |
| *H01J 37/26* | (2006.01) |
| *H05H 7/02* | (2006.01) |
| *H05H 7/22* | (2006.01) |

(Continued)

(52) U.S. Cl.
CPC ............... *H01J 1/34* (2013.01); *H01J 23/04* (2013.01); *H01J 25/34* (2013.01); *H01J 37/073* (2013.01); *H01J 37/26* (2013.01); *H05H 7/02* (2013.01); *H05H 7/22* (2013.01); *H05H 9/00* (2013.01); *H05H 15/00* (2013.01); *H05H 2007/025* (2013.01); *H05H 2007/225* (2013.01)

(58) Field of Classification Search
CPC .......... B82Y 20/00; G02B 6/107; G02B 6/34; G02B 6/1226; H01J 1/34
See application file for complete search history.

(56) References Cited

U.S. PATENT DOCUMENTS

| | | | |
|---|---|---|---|
| 8,490,210 B2* | 7/2013 | Hahn | G03F 1/50 250/306 |
| 2015/0255241 A1* | 9/2015 | Bonam | H01J 37/3174 313/542 |

OTHER PUBLICATIONS

Putnam, W., "Optical-field-controlled photoemission from plasmonic nanoparticles," Nature physics, vol. 13 (Apr. 2017).

(Continued)

*Primary Examiner* — David E Smith
*Assistant Examiner* — Hsien C Tsai
(74) *Attorney, Agent, or Firm* — Harness, Dickey & Pierce, PLC

(57) ABSTRACT

A dielectric coated plasmonic photoemitter is provided. An aspect of the present photonic apparatus includes a conductive photoemitter including a dielectric material coating or layered on a metallic core. The dielectric material being configured to enhance a local optical field strength and current density of the photoemitter as compared to a bare photoemitter without the dielectric layer. The dielectric layered photoemitter being tunable to transmit photoemissions from corners thereof with different photonic characteristics depending on a laser wavelength pulse received.

20 Claims, 17 Drawing Sheets

(51) Int. Cl.
*H05H 9/00* (2006.01)
*H05H 15/00* (2006.01)

(56) References Cited

OTHER PUBLICATIONS

Xie, W., "Chemically Linked AuNP—Alkane Network for Enhanced Photoemission and Field Emission," ACS Nono, vol. 3, No. 9 (2009).
Sivis, M., et al., "Continuous-wave multiphoton photoemission from plasmonic nanostars," Communications Physics (2008).
Dombi, P., "Ultrafast Strong-Field Photoemission from Plasmonic Nanoparticles," Nano Letters (2013).
Zhou, Y., "Theory of field emission from dielectric coated surfaces," Physical Review Research 2, 043439 (2020).
Zhou, Y., "Plasmon-Enhanced Resonant Photoemission from Metal Surfaces Coated with Ultrathin Dielectric," IVEC Conference (2021).
Henkel, C., "Resonant Tunneling Induced Enhancement of Electron Field Emission by Ultra-Thin Coatings," Scientific Reports (2019).
Zhang, P., et al., "Ultrafast strong-field photoelectron emission from biased metal surfaces: exact solution to time-dependent Schrodinger Equation," Scientific Reports (2016).

* cited by examiner

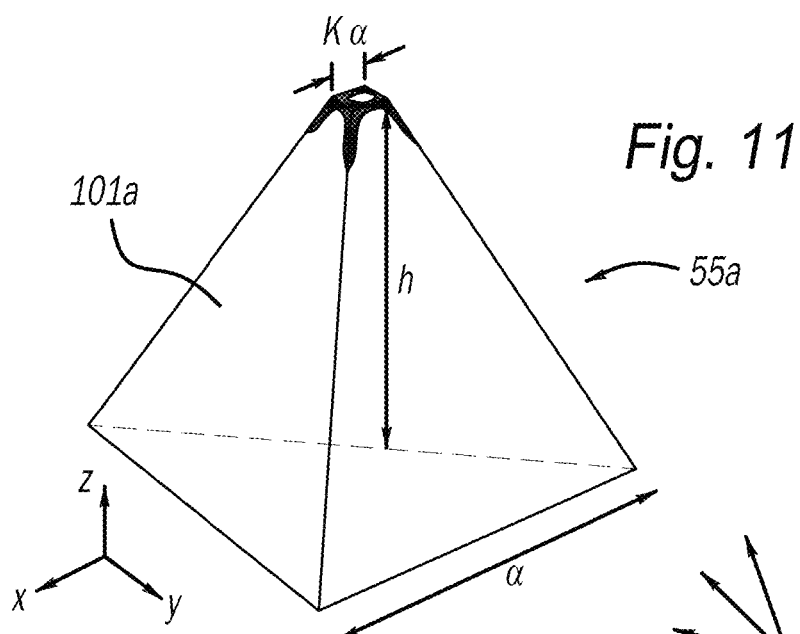
Fig. 11
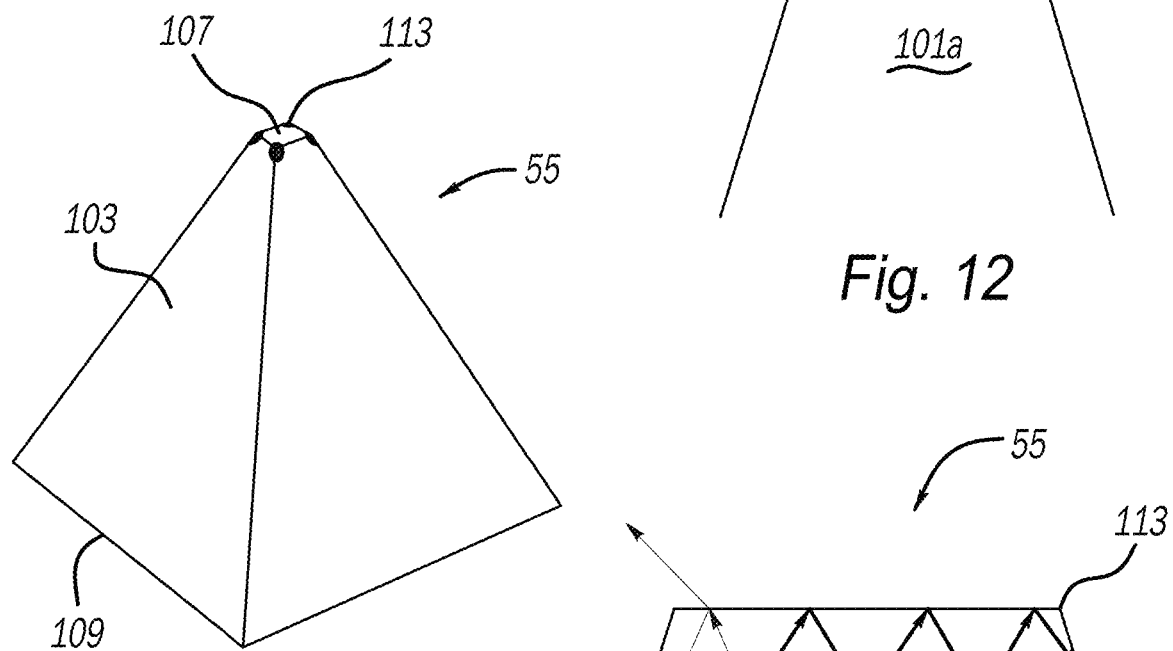
Fig. 12
Fig. 13
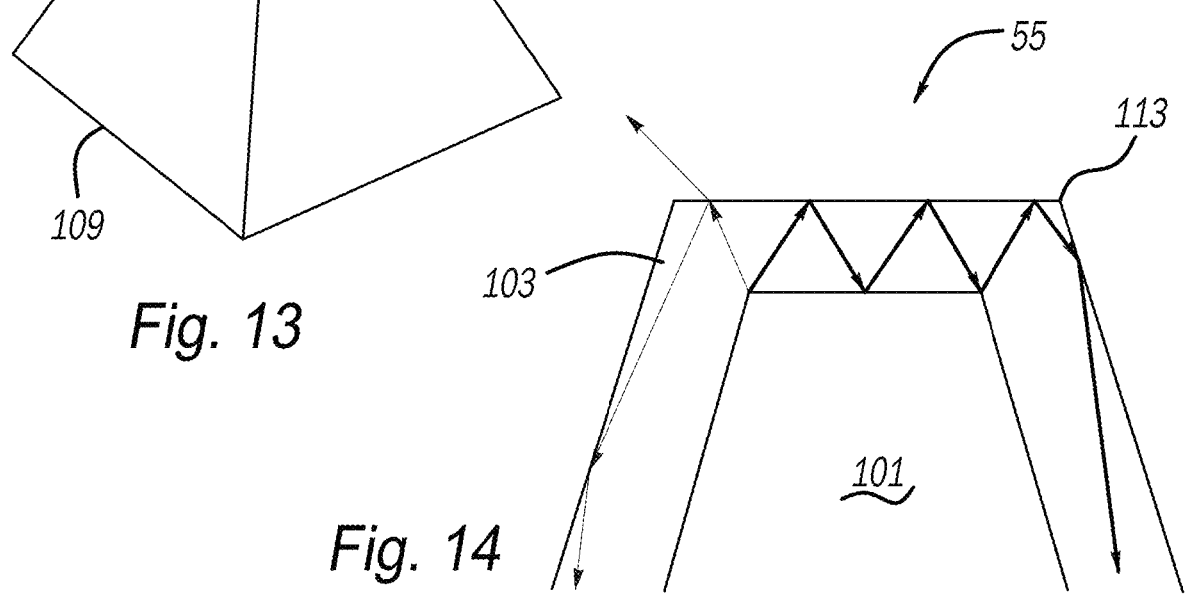
Fig. 14

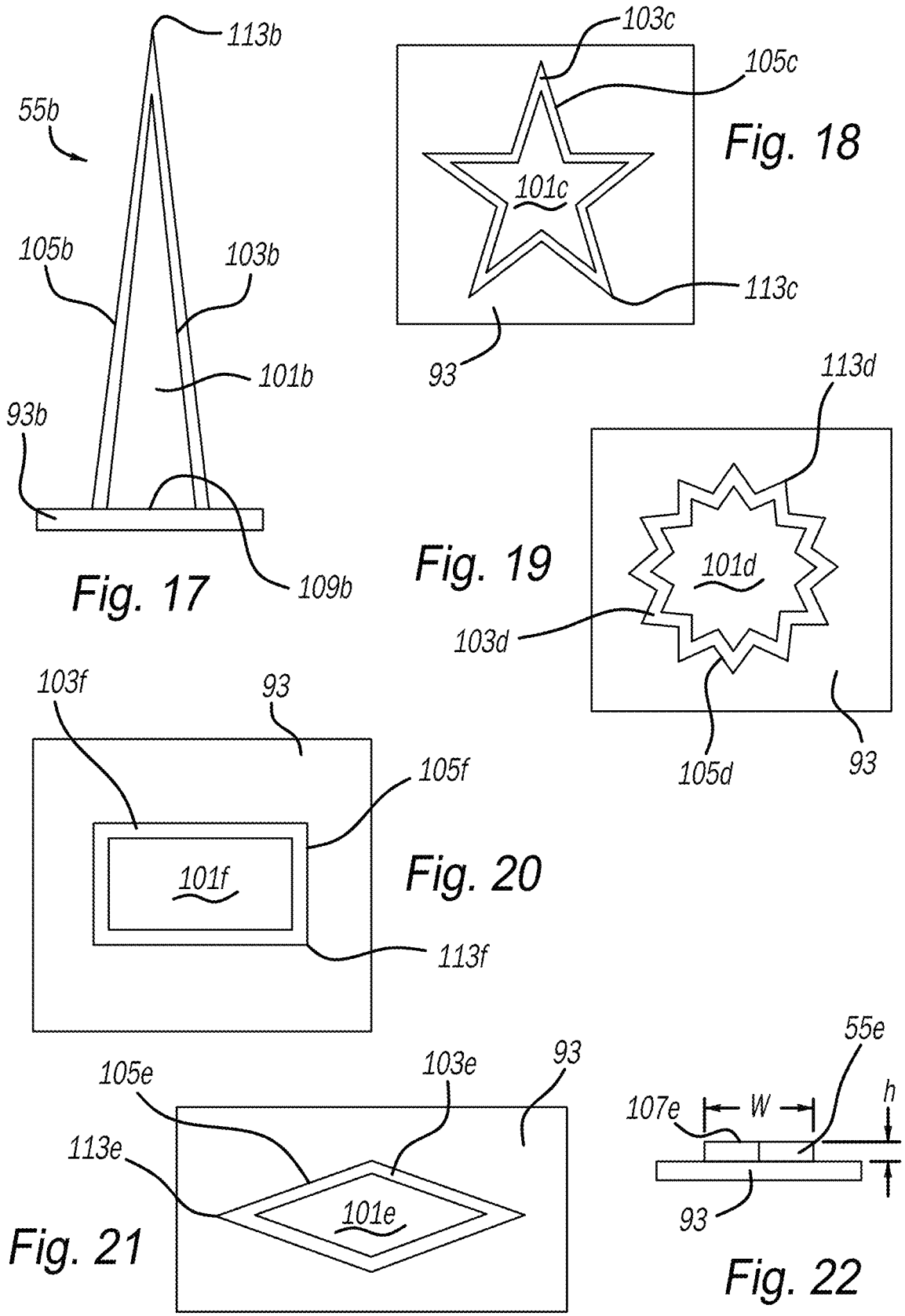

DIELECTRIC COATED PLASMONIC PHOTOEMITTER

CROSS-REFERENCE TO RELATED APPLICATION

The present application claims priority to U.S. provisional patent application Ser. No. 63/190,886, filed on May 20, 2021, which is incorporated by reference herein.

GOVERNMENT SUPPORT

This invention was made with government support under N00014-20-1-2681 awarded by the Office of Naval Research and FA9550-18-1-0061 awarded by U.S. Air Force Office of Scientific Research. The government has certain rights in the invention.

BACKGROUND AND SUMMARY

The present application generally pertains to photoemitters and more particularly to a dielectric coated plasmonic photoemitter.

Photoelectron emission, or photoemission, from a nanotip driven by an ultrafast laser offers an attractive route to generate high brightness, low emittance, and spatiotemporally coherent electron bunches, which are central to time-resolved electron microscopy, free-electron lasers, carrier-envelope-phase detection, and novel nanoelectronic devices. Despite extensive research exploring efficient multiphoton absorption at low laser intensities or optical field tunneling at high laser intensities, photoemission from nanotips is still limited by its low emission current and low quantum efficiency. It has been proposed to enhance the photoemission by adding a strong dc bias, but the optical field enhancement near the apex of the nanotip is still relatively low, typically only ten times, making the optical field tunneling accessible only at high incident laser fields, for example, 1.22 V/nm.

Metal nanoparticles could offer significantly high optical field enhancements due to the localized surface plasmon resonances, thus enabling strong-field photoemission at resonant wavelengths. For example, ultrafast generation of electrons from tailored metal nanoparticles has been demonstrated, and the role of plasmon resonant field enhancement in this process was unravelled by comparing resonant and off-resonant particles. Strong-field, carrier-envelope-phase-sensitive photoemission from arrays of metal nanoparticles has also been demonstrated, where the influence of the nanoparticle geometry and the plasmon resonance on the phase-sensitive response were studied. While highly nonlinear optical processes are typically achieved with ultrafast lasers, a localized three-photon photoemission was, however, demonstrated under continuous-wave illumination at sub-MW/cm2 from gold nanostars with feature size<5 nm, where the local intensity enhancement exceeds 1,000. Such plasmon-enhanced fields were found to drastically increase the photon-to-current conversion efficiency by over two orders of magnitude.

One such conventional plasmonic nanostar experiment is disclosed in Sivis, M., et al., "Continuous-Wave Multiphoton Photoemission from Plasmonic Nanostar," Communications Physics, 1:13 (2018). This finally formed nanostar, however, is bare with only its underlying glass slide bing ITO coated.

In accordance with the present invention, a dielectric coated plasmonic photoemitter is provided. An aspect of the present photonic apparatus includes: a conductive photoemitter having a proximal end connected to a substrate, and an opposite distal end that has a narrow width as compared to the proximal end, with a tapering side wall between the ends; a height dimension between the ends being at least twice that of the width of the distal end; a dielectric material coating or layered on the distal end and side walls of a core of the photoemitter, the dielectric material having a thickness of 0.1-4.5 nm; and the dielectric material being configured to enhance a local optical field strength and current density of the photoemitter as compared to a bare photoemitter without the dielectric layer.

In another aspect, a method of making and/or using a thin dielectric coated plasmon emitter operably produces a strong photoemission current and accesses optical field tunneling at very low laser intensities. A further aspect adds an atomically-thick dielectric coating to a nanoemitter to enhance a local optical field; this is advantageous since even a low intensity incidence laser can produce a sufficiently strong local field to give a strong photoemission. In yet another aspect, a single dielectric coated photoemitter is configured to operate at different resonant wavelengths, thereby beneficially achieving tunable resonant photoemissions.

By using an atomically-thick dielectric coating on a metal nanoemitter, the present apparatus is expected to achieve optical field tunneling of ultrafast-laser induced photoemission occurring at an ultralow incident field strength of 0.03 V/nm. This coating strongly confines plasmonic fields and provides secondary field-enhancement beyond the geometrical plasmon field-enhancement effect, which can substantially reduce the barrier and enable more efficient photoemission. It is numerically demonstrated that a 1 nm thick layer of SiO2 around an Au-nanopyramid will enhance the resonant photoemission current density by two orders of magnitude, where the transition from multiphoton absorption to optical field tunneling is accessed at an incident laser intensity at least 10 times lower than that of the bare nanoemitter.

The present apparatus and method coat metallic nanoemitters with an atomically-thick dielectric to further enhance the plasmonic photoemission, where the optical field tunneling can be accessed at a significantly reduced incident laser intensity. The physics behind this effect lies in the considerably enhanced plasmon resonant fields highly confined within the dielectric coating (in addition to the geometrical plasmon field-enhancement), and the lowered tunneling barrier due to the electron affinity. A quantum photoemission model is employed to investigate the photoemission processes under the plasmon resonant condition on both bare and coated Au-nanopyramid field emitters. The present mechanism is independent of the geometry of the metal nanoemitter; and practically the coating could protect the metal nanoemitters from corrosion or metal-atom migration under intense optical fields. The present apparatus and method advantageously result in the fabrication of strong-field photoemitters with higher yield and longer lifetime.

The present apparatus and method also beneficially employ a dc field to greatly enhance the photoemission by narrowing the surface potential and such electron emission mechanisms as photo-assisted emission and direct tunneling are obtained. Calculations from the present model also demonstrate that the photoemission from the present dielectric coated nano-emitter is enhanced in the relatively smaller laser field range ($F_{ext}$<0.03 V/nm) compared with the bare emitter. Additional features and advantages can be ascertained from the following description and appended claims taken in conjunction with the accompanying drawings.

BRIEF DESCRIPTION OF THE DRAWINGS

FIG. 11 is a perspective view showing a simulated resonant field enhancement for the bare photoemitter;

FIG. 12 is a diagrammatic view showing plasmonic field decay for the bare photoemitter;

FIG. 13 is a perspective view showing a simulated resonant field enhancement for the present coated photoemitter;

FIG. 14 is a diagrammatic view showing plasmonic field confinement for the present coated photoemitter;

FIG. 17 is a diagrammatic side view showing an alternate shape for the present coated photoemitter;

FIGS. 18-21 are diagrammatic top views showing alternate shapes for the present coated photoemitter;

FIG. 22 is a diagrammatic side view showing the alternate shape for the present coated photoemitter of FIG. 21;

DETAILED DESCRIPTION

Figure 1:
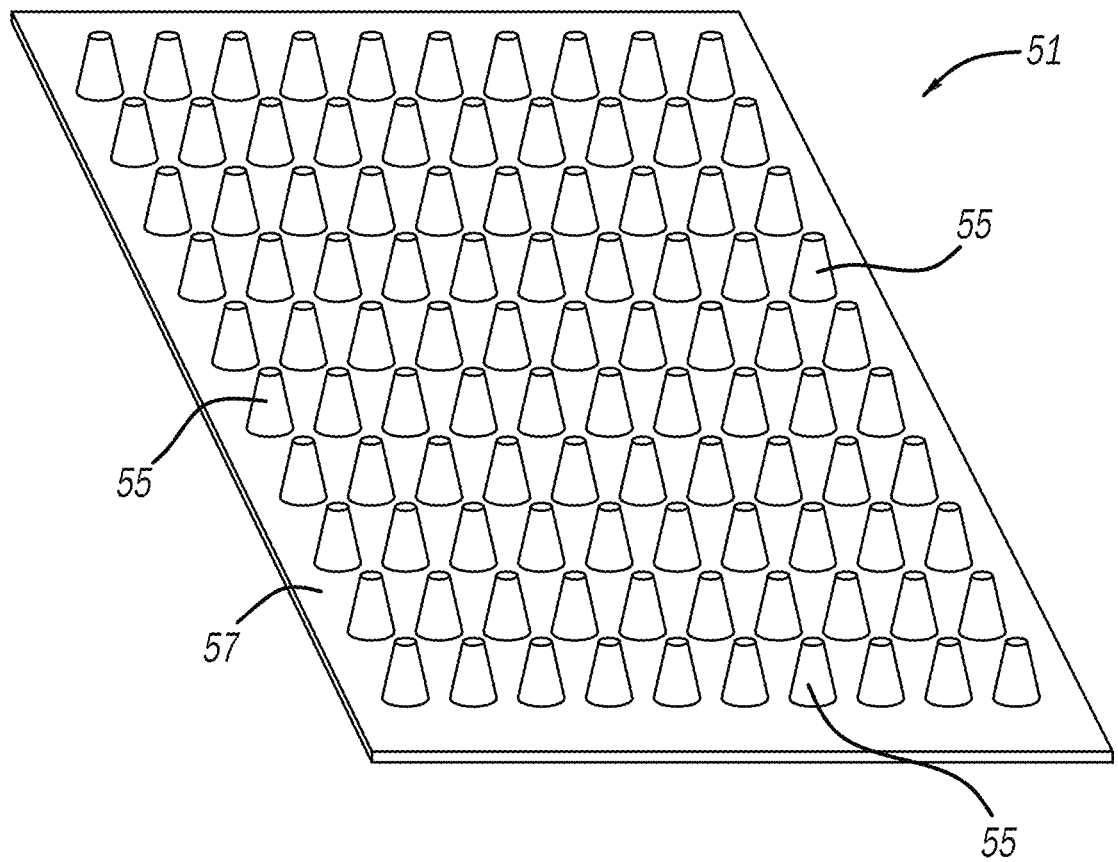
FIG. 1 is a perspective view showing a photoemitter of the present application.

FIG. 1 shows a preferred configuration of a plasmonic photoemitter apparatus 51 and more specifically, an array of dielectric coated photoemitters 55 projecting from a generally flat substrate 57. An array of coated emitters, or combining dc bias and laser excitation, are envisioned to improve the emission current at a given laser intensity. For example, it is envisioned that at least ten-by-ten dielectric coated photoemitters 55 be arranged in spaced apart rows and columns. The present dielectric coated photoemitters provide high-coherence, tip-based, and nonlinear photoelectron emissions when driven and energized by ultrafast laser beam interaction.

Photoelectron emission from the present tip-shaped cathodes, such as dielectric coated photoemitters 55, are an enabling technology for such use applications as dielectric laser accelerators, free electron lasers, ultrashort X-ray sources, time-resolved electron microscopes, ultrafast electron diffraction, carrier-envelope detection, and optoelectronics, due to high brightness, low emittance, capability of spatiotemporal scale control, and carrier-envelope phase sensitivity of the dielectric coated photoemitters. Those applications allow for the exploration of matter at a temporal resolution of femtosecond and at a spatial resolution of nanometer, while they pose a challenge to conventional bare photocathodes due to efficiency and stability concerns. The nanoemitter emits electrons in a vacuum chamber. An electrical circuit, including a power source, is attached to the substrate such that the core acts as a cathode which is spaced away from an anode. It is noteworthy that the present atomic dielectric layer is different in composition and function from a natural oxide layer.

Figure 2:
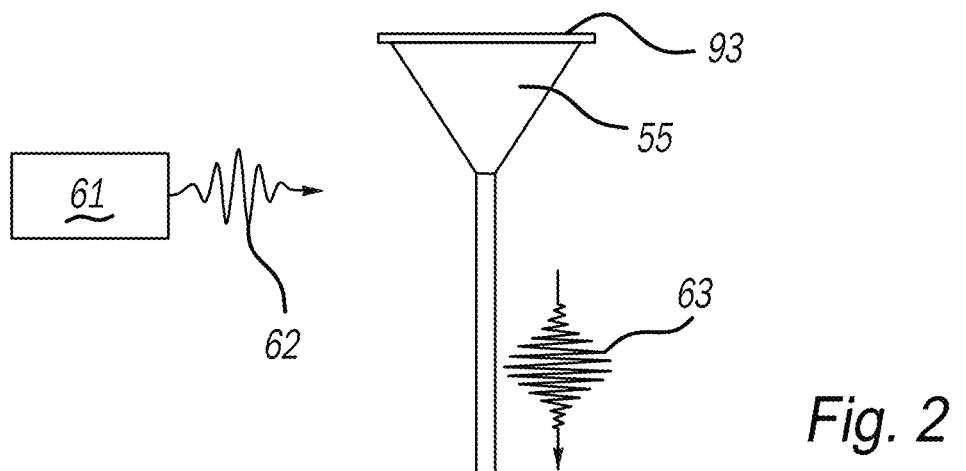
FIG. 2 is a diagrammatic view showing the present photoemitter used in an electron microscope.

FIG. 2 illustrates a first exemplary use application wherein an ultrafast electron microscope apparatus employs dielectric coated photoemitter 55. A laser 61 emits a laser beam, preferably a set of laser pulses 62 each having a duration of 50-100 fs, which energize dielectric coated photoemitter 55 and cause it to emit photoelectrons 63. These photoelectron plasmatic emissions are received by a workpiece specimen 65 such that an imaging detector, such as a CCD camera 67, creates images therefrom.

Figure 3:
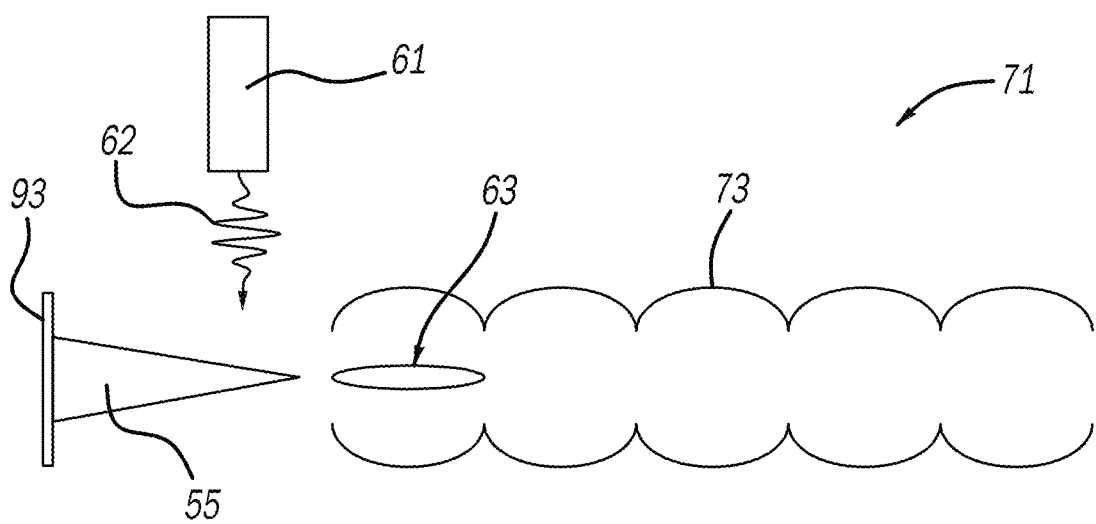
FIG. 3 is a diagrammatic view showing the present photoemitter used in a particle accelerator.

A second exemplary use application can be observed in FIG. 3. A particle accelerator apparatus 71 includes laser 61 from which, its laser pulses 62 drive dielectric coated photoemitter 55. This causes the dielectric coated photoemitter to emit a photoelectron pulse 63 along radio frequency accelerator cavities 73.

Figure 4:
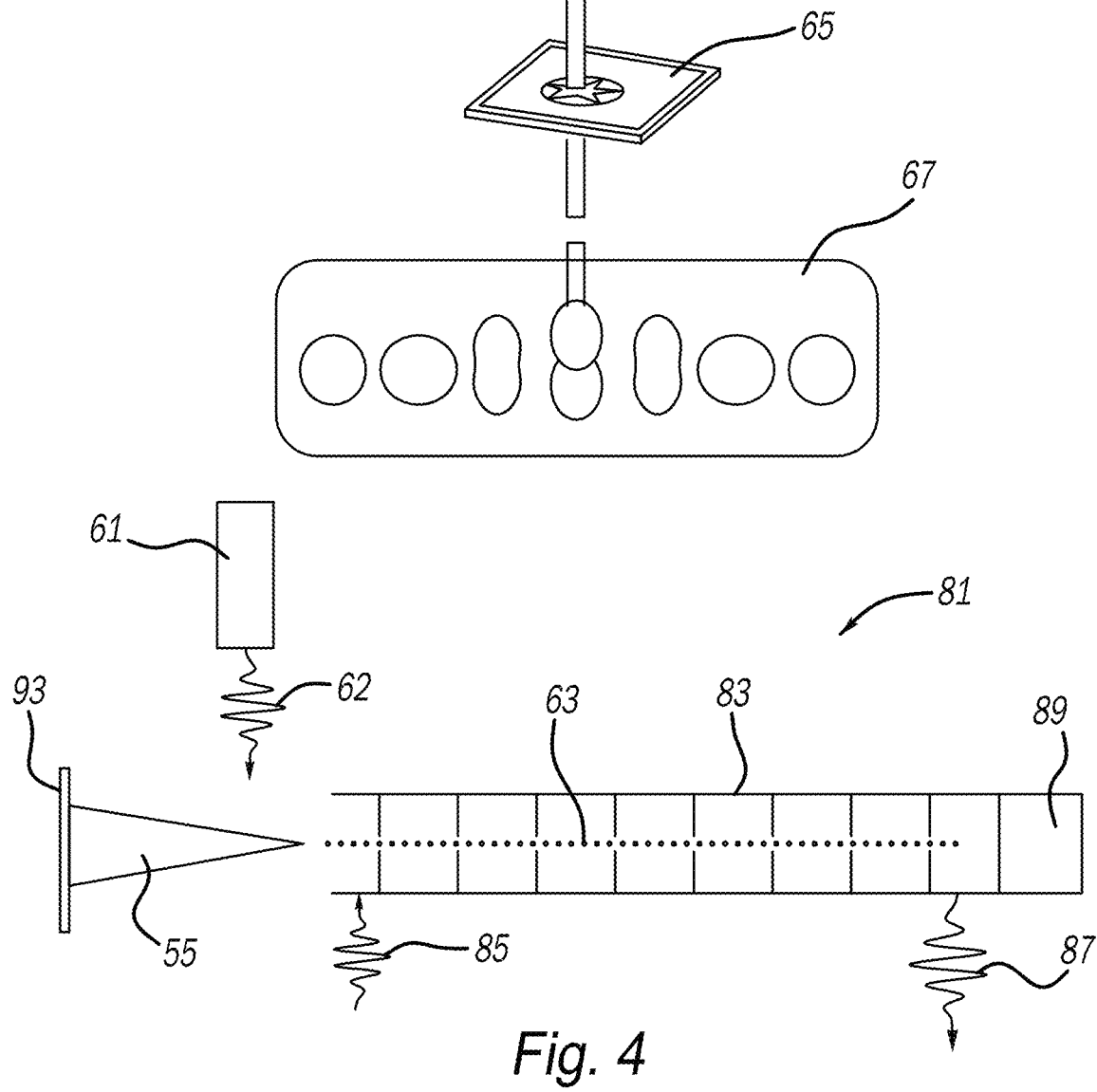
FIG. 4 is a diagrammatic view showing the present photoemitter used in a traveling wave tube.

Referring to FIG. 4, a third exemplary use application is of a traveling wave tube 81. This apparatus includes laser 61 which sends laser pulses 62 for driving and energizing dielectric coated photoemitter 55, acting as an electron gun. This causes the dielectric coated photoemitter to emit photoelectrons 63 therefrom along a slow wave vacuum tube structure 83. A radio frequency signal input 85 and a radio frequency signal output 87, in a microwave range, are amplified in the vacuum tube structure by absorbing power from the electrons as they pass down the tube structure. A collector 89 is located at an opposite end of the tube from the present photoemitter, and returns the collected photoelectrons in a circuit. Such traveling wave tubes can be used as amplifiers and oscillators in radar systems, communication transmitters and the like.

Figure 5:
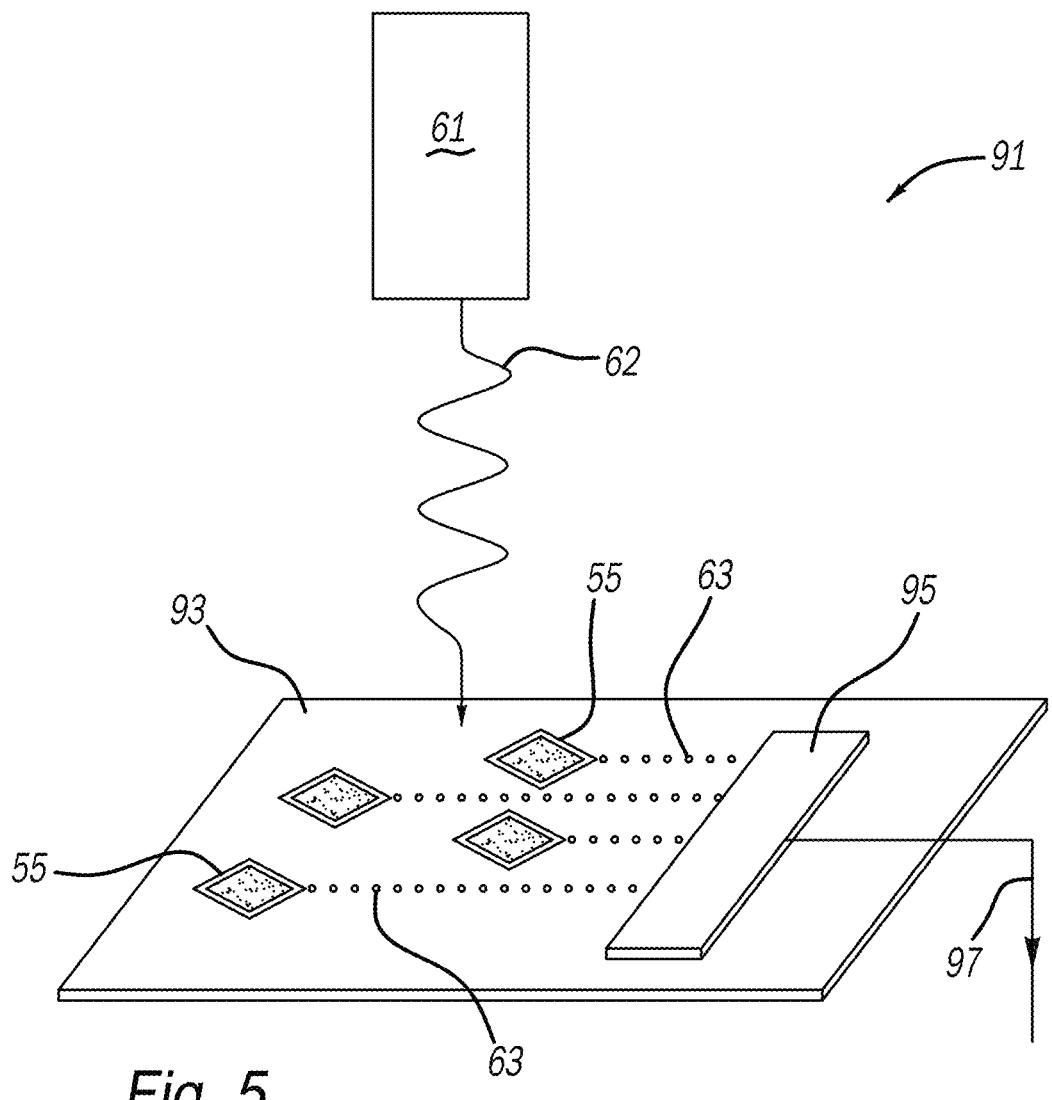
FIG. 5 is a diagrammatic view showing the present photoemitter used in a photodetector.
Figure 6:
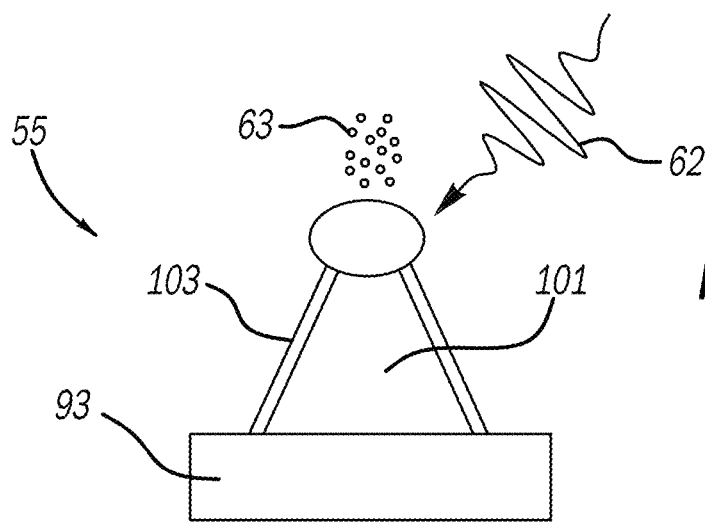
FIG. 6 is a diagrammatic side view showing the present photoemitter in an emission condition.
Figure 7:
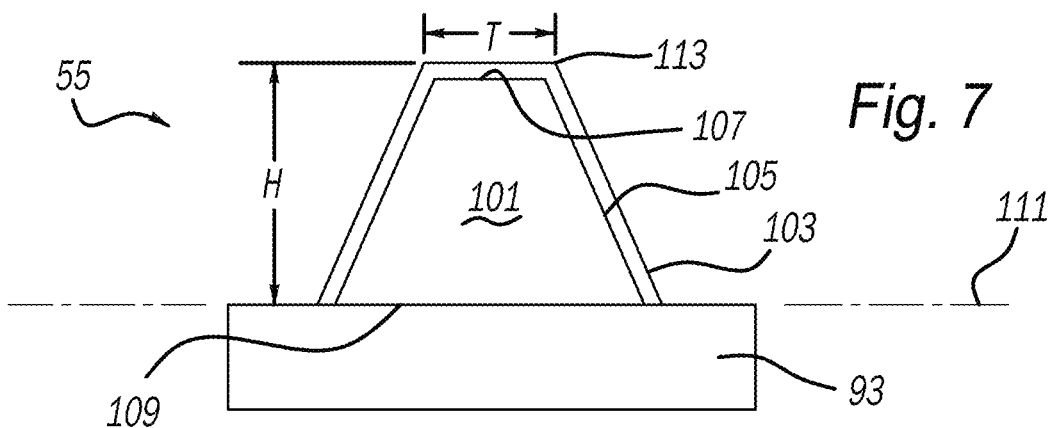
FIG. 7 is a diagrammatic side view showing the present photoemitter.

A fourth exemplary use application is shown in FIG. 5. A photodetector apparatus 91 includes laser 61 which sends laser pulses 62 for driving and energizing dielectric coated photoemitters 55, which are mounted upon a laterally enlarged substrate 93. This causes the dielectric coated photoemitter to emit photoelectrons 63 therefrom which are received by a current collector electrode 95. Furthermore, collector electrode 95 is positioned adjacent an edge of substrate 93 and is connected to an electrical circuit 97. Photodetector 91 is also known as a photosensor or spectrophotometer.

More specifically, the construction of each dielectric coated photoemitter 55 can be seen with reference to FIGS. 6-9. A preferred embodiment of a truncated pyramidal shaped nano-emitter or photoemitter core 101 is made of Au (gold). A dielectric coating or layer 103 is on side and distal end surfaces 105 and 107, respectively, of metallic core 101, and the core has a base or proximal end surface 109 mounted to a conductive (e.g., metallic) substrate 93 of laterally enlarged size. The core can be a single piece with the substrate, such that during manufacturing, the core may be etched to project from the substrate in a generally perpendicular direction from a laterally oriented plane 111.

The thin coating layer 103 preferably has a thickness of 0.1-4.5 nm, more preferably 0.5-4.0 nm, and even more preferably 1.0-4.0 nm, and most preferably 1.0 nm. Coated side wall surfaces 105 are inwardly tapered from proximal end 109 to distal end 107, and a projecting height H of coated core 101 is at least twice that of its coated distal end thickness T. Thus, there are at least two, and preferably four, corners 113 on coated distal end 107 of photoemitter 55, which may have a slightly rounded shape when viewed in an enlarged manner like that illustrated in FIG. 26.

Core 101 is preferably made from gold, doped silicon, or an alloy thereof, and dielectric coating layer 103 is preferably ceramic, $Al_2O_3$, $SiO_2$, or a composite thereof. Notably, the materials for the core and dielectric coating are different from each other. However, it is desired that the material for substrate 93 be gold, like that of core 101.

Alternately, the coating may be graphene, nano-diamond and zinc dioxide. The coating is fabricated on top of the cores of the cathodes to protect them from degradation by ions, electron bombardment and oxidization under poor vacuum conditions. Coating layers not only elongate the operational lifetime and the current stability of photocathodes, but also enhance the quantum efficiency of photoemission by lowering the effective work function or the enhancement of the laser field.

The present Au emitters can be customized to suit different laser sources to modulate the photoemission pattern and control the emission intensity. In one such example illustrated in FIG. 9, the magnitude of the emission current density is generally higher under the excitation of a 820 nm laser (lower photon energy) for a given incident laser field strength, due to stronger field enhancements 115 near the emitter tip 107. It should be noted that the dominant photoemission process is 3-photon absorption for both 620 nm (FIG. 8) and 820 nm (FIG. 9) laser excitations, as the ratio of barrier height to photon energy $W_{eff}/\hbar\omega>2$ for both cases. Hence, the emission current is primarily determined by the local field strength other than the photon energy, yielding a larger emission current from the 820 nm laser. The corresponding Keldysh parameter $\gamma_{loc}\approx1$ suggests a transition from multiphoton absorption to optical field tunneling at an incident field strength as low as 0.03 V/nm.

In summary, the present apparatus includes coated metal nanoemitters with an atomically-thick dielectric to significantly enhance photoemission, due to the combined effects of the significantly localized (hence enhanced) plasmon resonant fields and the reduced potential barrier induced by the coating. The results indicate that dielectric coatings with higher refractive index can better confine and enhance the optical fields near the emitter tip, leading to a larger photoemission current. This can be observed by comparing the resonant photoemission, plasmonic field decay for a bare photoemitter core 101a in FIG. 12 with the plasmonic field confinement of the present coated photoemitter shown in FIG. 14.

Figure 10:
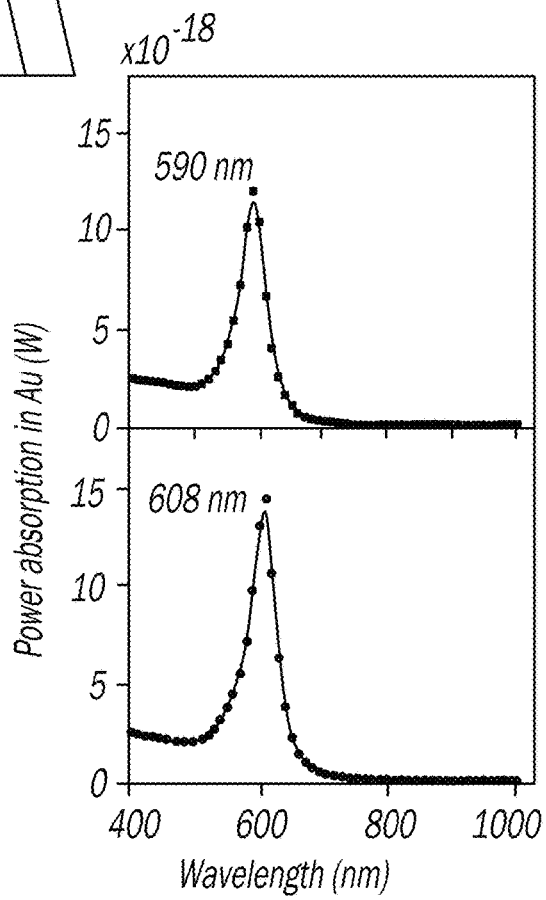
FIG. 10 shows graphs of resonant plasmonic excitation (power absorption versus wavelength) for a bare photoemitter and for the present coated photoemitter.

The present thin dielectric coated plasmonic photoemitter apparatus 55 includes the design of an efficient plasmon resonance mode—antenna mode, so that the incident optical energy is maximally concentrated to the tip of the emitter. FIG. 10 illustrates the schematics of the bare (top graph) and coated (bottom graph) Au-nanopyramid field emitters sitting on an Au film substrate, and their plasmon resonances excited by a z-polarized light from the side. Here, the choice of substrate and incident polarization is to assist the efficient excitation of the antenna mode.

Figure 15:
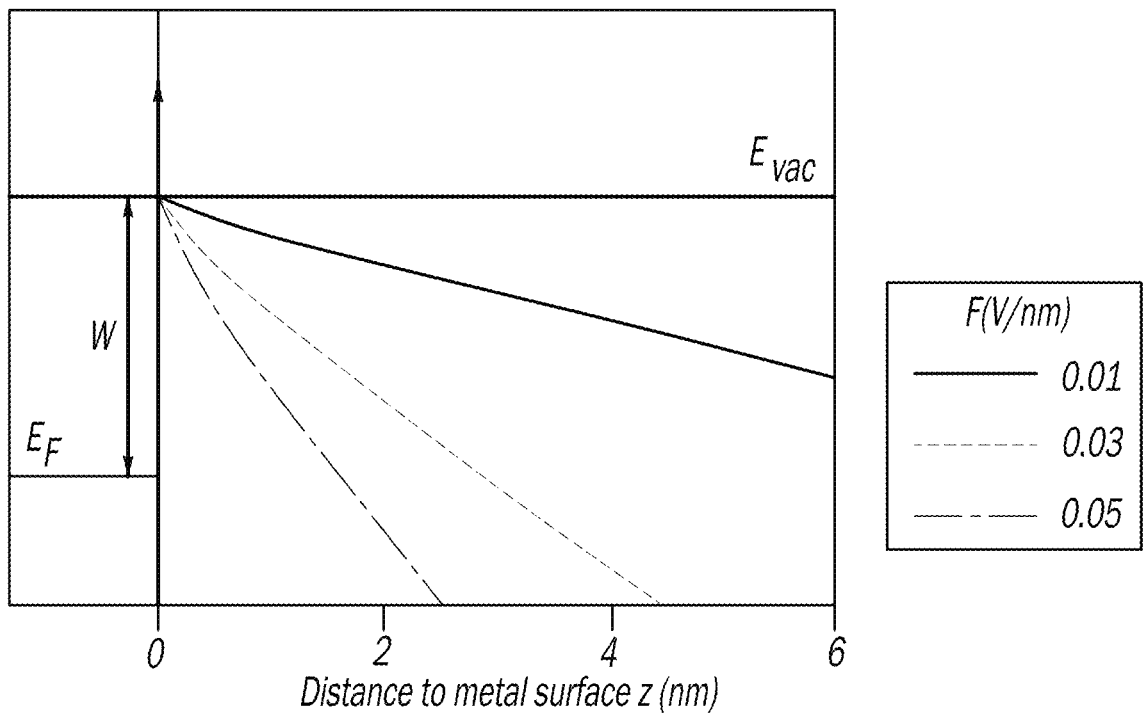
FIGS. 15 and 16 are graphs showing tunneling barriers induced by different incident laser field strengths for the bare photoemitter and the present coated photoemitter, respectively.

With further reference to the bare core 101a photoemitter 55a of FIG. 11 and the present coating 103 on the core shown in FIG. 13, the nanopyramid emitter has side length of a at the proximal bottom surface or κa at distal top surface, and a projecting longitudinal height h, either naked (bare) in vacuum or coated with thin dielectric layer 103 of thickness d and refractive index n. The geometrical settings of the nanopyramid emitters (a, κ, and h) are used to design the resonant wavelength of the antenna mode. FIGS. 11 and 13 illustrate corresponding simulated resonant field enhancements βAu at the Au surface, with FIGS. 12 and 14 showing the mechanism of the plasmonic field confinement operably providing a secondary field-enhancement. In the simulation, the nanopyramid has fixed side length a=40 nm, height h=40 nm, and aspect ratio κ=0.1. It is either naked/bare or coated with the dielectric layer with thickness d=1 nm and refractive index n=1:5. Furthermore, FIGS. 15 (590 nm, bare) and 16 (608 nm, coated layer 103) show expected potential profiles of the tunneling barriers induced by different incident laser field strengths F.

Resonant photoemission will now be discussed. For a typical emitter with a=h=40 nm and κ=0:1, under the illumination of z-polarized light from the side, the antenna mode at 590 nm for the bare emitter or 608 nm for the coated emitter (d=1 nm, n=1:5) is expected. Though occurring at similar resonant wavelengths, the plasmon resonant field-enhancement and the underlying microscopic physics differs drastically. As shown in FIGS. 11 and 12, for the bare Au-nanopyramid—a typical plasmonic nanostructure, the enhanced plasmonic field concentrates at the sharp corners of the Au core 101a (maximum field enhancement βAu=35), and its magnitudes exponentially decay into the vacuum, dying out at a distance of <10 nm. In contrast, FIGS. 13 and 14 illustrate that for photoemitter 55 having dielectric coating 103 with a refractive index n, creates an interface with the vacuum. This interface helps to reflect and confine the plasmonic fields into an even smaller volume, effectively forming a dielectric waveguide that can locally enhance the fields at the Au surface. As a consequence, the maximum field enhancement at the Au tip βAu increases from 35 to 200 (corresponding to optical intensity enhancement from 1,225 to 40,000) due to the combined effects of geometrical plasmon field-enhancement and a secondary field-enhancement from the plasmonic field confinement. It is worth noting that this secondary enhancement occurs at the metal surface due to the plasmonic field confinement is applicable to any plasmonic nanostructure supporting the antenna mode.

The present dielectric coated nanoemitter allows for differently tunable resonances, for example and not being limited to 620 nm and 820 nm, from the same emitter by shining different laser light wavelengths thereon. Furthermore, the present dielectric coated nanoemitter beneficially increases and enhances emitted local field strength, which leads to increased electron emissions. It also reduces and narrows an electrical potential barrier such that the emitted electrons can tunnel through the barrier.

FIGS. 18-22 illustrate alternate shapes for the present photoemitter electrode. An outer dielectric layer is coated on an exterior of the core plasmatic structure. For example and with reference to FIG. 17, one photoemitter electrode 55b has a conical cross-sectional shape, of a conical curved side surface 105b or with multiple flat side surfaces, with its lower base 109b secured to a laterally enlarged substrate 93b. A dielectric coating layer 103b encapsulates the exposed surfaces of a core 101b, and there is a single apex or corner 113b at a distal end thereof. The longitudinally projecting height off of the substrate is at least three times the lateral width of proximal end 109b. Other examples, include: a star top-view peripheral surface 105c (FIG. 18) of a dielectric coating 103c on a core 101c defining at least five pointed corners 113c; multifaceted radiating points 113d (FIG. 19) from an undulating and polygonal peripheral surface 105d of a dielectric coating 103d on a similarly shaped core 101d; a diamond peripheral surface 105e (FIGS. 21 and 22) of a dielectric coating 103e on a similarly shaped core 101e creating pointed corners 113e; and a rectangular periphery 105f (FIG. 20) with four corners 113f of a dielectric-coated layer 103f on a core 101f. The points laterally point in directions generally parallel to a laterally enlarge planar surface to which the cores are attached. The star version, for instance, can be used for a single occasion emission in a biological solution containing nanoparticles and a tissue matrix for cancerous tumor destruction. For the coated photoemitters of FIGS. 18-22, the lateral width W is at least ten times that of the longitudinal height h above substrate 93, and distal surface 107e is generally flat and parallel with plane 111 (see FIG. 7) of the substrate. Distal surface 107e may be dielectrically coated or bare for all of these alternate embodiments.

The maximally enhanced field is located in the dimer gap for bonding dipole plasmon (BDP). Thus, the underlying enhancing mechanisms are: (i) plasmonic field confinement following the boundary conditions at the dielectric-vacuum interface; and (ii) high refractive-index dielectric coating contributes to strong light coupling effect in terms of improving the light absorption efficiency.

In the current context, the tremendously increased field enhancement βAu at the Au surface from the antenna mode is particularly desirable, which can vastly facilitate the photoemission process to operate at the optical field tunneling regime at a much lower incident field as explained below. To understand the photoemission process, the time dependent potential barrier ϕ(z, t) that is faced by the free electrons in Au to tunnel through and emit is first considered. In the dielectric region, 0<z<d, it is written as:

$$\phi(z, t) = V_0 - eF\cos(\omega t)\int_0^z \beta(s)ds \cong V_0 - eF\cos(\omega t)\left(\frac{\beta_D - \beta_{Au}}{2d}z^2 + \beta_{Au}z\right), \quad (1)$$

where z denotes the distance to the top surface of Au tip; $V_0 = W + E_F - \chi$ is the nominal potential barrier height at the Au surface, where W=5.1 eV and EF=5.53 eV are the work function and Fermi energy of Au, and X is the electron affinity of the dielectric layer; e is the elementary charge, $\omega = 2\pi C/\lambda$ denotes the angular frequency with the laser wavelength λ, where c is the speed of light in vacuum, and F represents the incident laser field strength. The near-field information is taken care of by the exact near-field enhancement profile β(z) that is extracted from our optical simulations and fitted using a linear function of distance $\beta(z) = \beta_{Au} - (\beta_{Au} - \beta_D)z/d$, with $\beta(0) = \beta_{Au}$ at the Au surface and $\beta(d) = \#3D$ at the dielectric/vacuum interface, respectively. In the free space region, z>d, the potential profile reads:

$$\phi(z, t) = W + E_F - eF\cos(\omega t)\left(\frac{\beta_{Au} - \beta_D}{2}d + \beta_D z\right), \quad (2)$$

where the field enhancement is assumed constant $\beta_D$. To ensure a fair comparison, optical simulations employ exactly the same settings for both bare and coated emitters, but set n=1 to the dielectric for the bare emitter. As a result, the potential profiles described above also apply to the bare emitter, where the electron affinity χ=0 is set for the dielectric.

Figure 16:
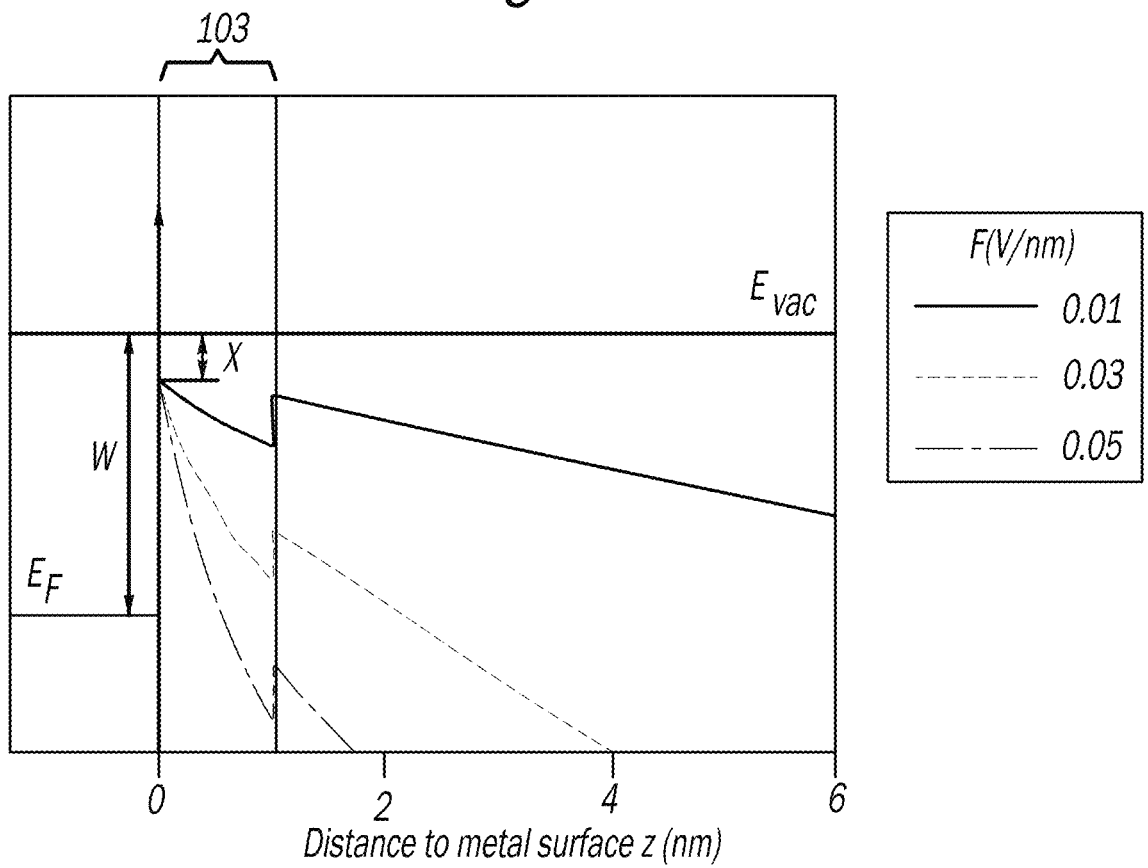

Returning to FIGS. 15 and 16, a plot of their expected potential barrier profiles ϕ(z, t=0) induced by different incident laser field strengths can be observed. The presence of dielectric coating not only reduces the height of the potential barrier due to the electron affinity of the dielectric layer χ; but also significantly narrows the barrier, because of the much stronger field enhancement at the Au surface $\beta_{Au}$. This barrier narrowing effect becomes even more profound for larger incident laser fields, as indicated by the irregular 0.05 dashed lines.

Double-barrier tunneling is next discussed. Despite the barrier narrowing effect from the dielectric coatings, electrons inside the metal now need to overcome two barriers to get photoemitted, presumably via multiphoton absorption, photo-assisted tunneling through either vacuum or the dielectric layer, or direct optical field tunneling. The probability for each of these processes depends on the electron initial energy E and the overall potential barrier for a given incident is employed which is the exact solution of the time-dependent Schrödinger equation subject to an oscillating triangular barrier.

Figure 23:
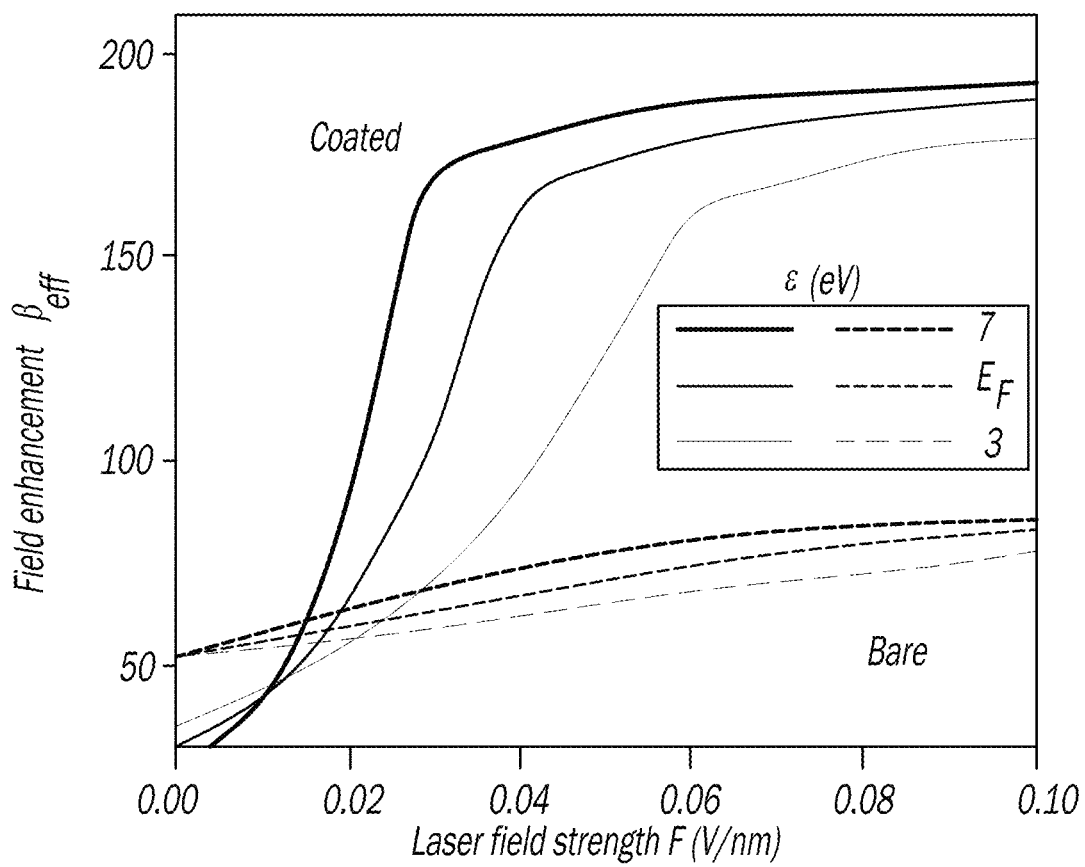
FIG. 23 is a graph showing calculated field enhancement versus laser field strength for the present coated photoemitter compared to the bare photoemitter.
Figure 24:
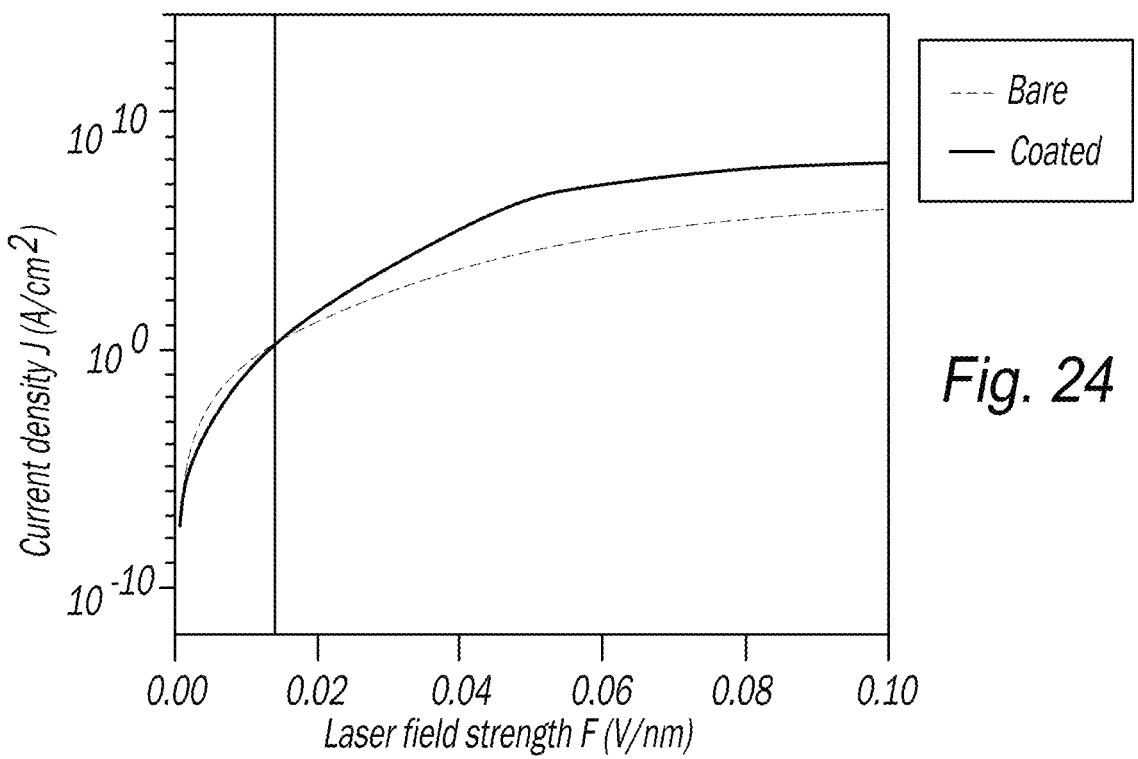
FIG. 24 is a graph showing current density versus laser field strength for the bare photoemitter versus the present coated photoemitter.

FIGS. 23 and 24 illustrate theoretical modelling of double-barrier tunneling. More specifically, FIG. 23 shows the calculated $\beta_{eff}$ for various $\epsilon$, and FIG. 24 depicts the photoemission current density J as a function of incident laser field strength F, for the bare or coated emitters. In FIG. 23, the $\epsilon$-dependent effective optical field enhancement factor $\beta_{eff}$ is plotted as a function of incident laser field strength F at three electron initial energies $\epsilon$ for both coated and bare emitters. The coated emitter has improved $\beta_{eff}$ over the bare emitter only for F exceeding certain threshold, e.g., 0.018 V/nm for Fermi electrons with $\epsilon=E_F$. This can be explained by the barrier profiles in FIG. 1c. When F is small (solid thick lines 7), the second barrier peak at the dielectric/vacuum interface can be higher than that at the Au surface. This results in $\beta_{eff}$ smaller than that in the bare emitter due to the double-barrier profile. But when F is large (dashed thick lines $E_F$), the second barrier peak is lowered, and $\beta_{eff}$ is predominantly determined by the significantly increased field enhancement at the Au surface $\beta_{Au}$.

The photoemission current density is then calculated:

$$J = e \int_0^\infty N(\epsilon) D(\epsilon) d\epsilon, \qquad (3)$$

where $$N(\varepsilon) = \frac{mk_BT}{2\pi^2\hbar^3} \ln\left[1 + \exp\left(\frac{E_F - \varepsilon}{k_BT}\right)\right]$$

represents the number density of electrons inside the metal impinging on the surface with longitudinal energy $\epsilon$ across unit area per unit time, m is the electron mass, $k_B$ is the Boltzmann constant, T is the temperature, and h is the reduced Planck constant. The electron emission probability $D(\epsilon)$ is calculated based on the quantum theory of photoemission, which is the exact solution of the time-dependent Schrödinger equation subject to an oscillating triangular barrier. As the linear size of the nanoemitter is about 40 nm in height, which is much longer than the electron De Broglie wavelength (~0.52 nm for Fermi electrons with $\epsilon=E_F=5.53$ eV), the quantum model is appropriate to study the photoelectron emission. It is also worth highlighting that the model takes into account the contributions from all the possible j-photon absorption ($\epsilon+jh\omega$) processes, and is valid from multiphoton absorption to optical field tunneling regime. Nevertheless, it should be noted that our model currently ignores the possible effects of charge trapping inside the dielectric coating material and space charge in the potential barrier and electron transmission.

The calculated emission current density J as a function of incident laser field strength F is shown in FIG. 24. In regime I when F<0.014 V/nm, the emission current density from the coated Au tip is close to that from the bare tip, because of the smaller effective enhancement factor $\beta_{eff}$, as indicated by the lowered but widened barrier for Fermi electrons at F=0.01 V/nm (inset). However, in regime II when F>0.014 V/nm, the coated Au emitter outperforms the bare emitter, due to the combined effects of increased $\beta_{eff}$ and lowered potential barrier, e.g., Fermi electrons at F=0.1 V/nm (inset). For laser fields over a wide range of F=0.014-1 V/nm, J from coated emitter is enhanced by at least two orders of magnitude as compared to the bare emitter. The threshold laser field 0.014 V/nm, at which the coated emitter outperforms the bare emitter, can also be derived when $\beta_{eff}$ of the coated emitter exceeds that of the bare emitter for Fermi electrons, i.e., 0.018 V/nm in FIG. 23. Interestingly, the increment of the current density J from the coated emitter slows down at higher incident laser fields F>0.05 V/nm (FIG. 24), due to the saturation of $\beta_{eff}$ at larger F (FIG. 23). The decreased slope suggests that the coated emitter has probably entered into the optical field tunneling regime, as it follows the Fowler-Nordheim current density scaling law.

The coated emitter reaches the optical field tunneling regime at less than one third of the incident laser field strength as compared to the bare emitter. In other words, the optical field tunneling regime can be accessed at an incident laser intensity of about 10 times smaller with the dielectric coating.

Figure 25:
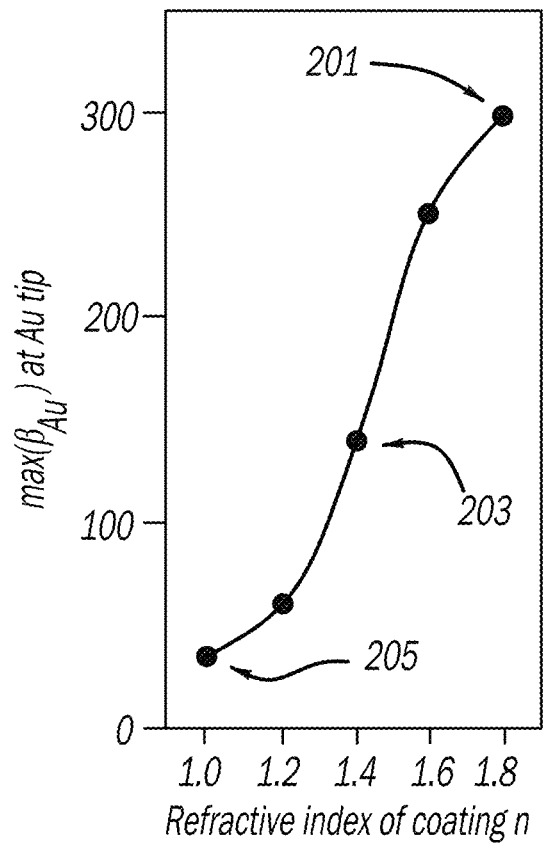
FIG. 25 is a graph showing dependence of maximum field enhancement at the tip of the present coated photoemitter, based on refractive indices.
Figure 27:
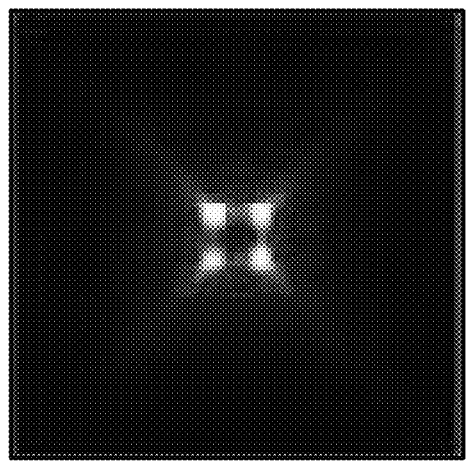
FIGS. 27-29 are a series of top diagrammatic views showing expected dependence of maximum field enhancement at the tip of the present coated photoemitter, based on refractive indices, corresponding to FIG. 25.
Figure 28:
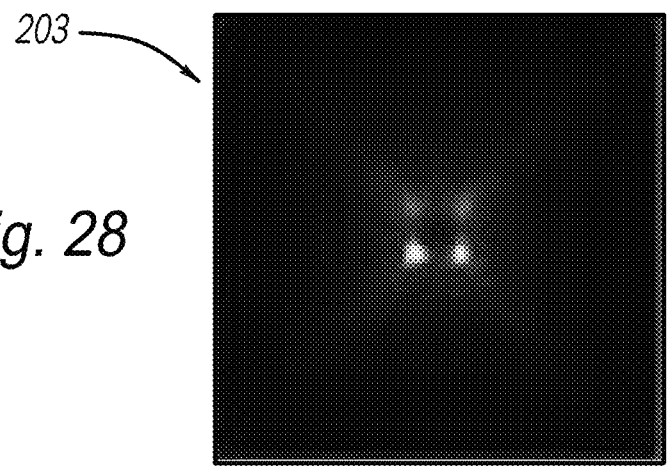
Figure 29:
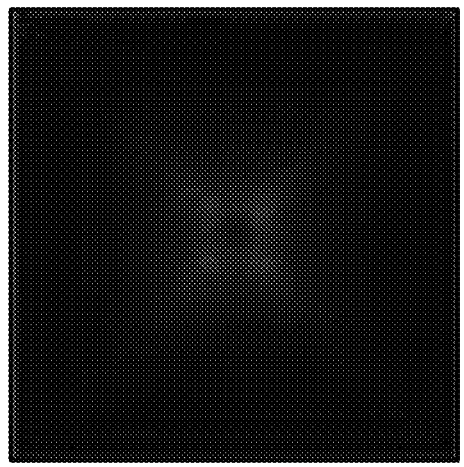

The example described above has a fixed dielectric coating. In FIG. 25, the photoemission depends on the refractive index n and thickness d of the dielectric coatings, while the electron affinity $\chi=1$ eV is assumed constant, but set to zero for the bare emitter of n=1. Firstly, as n increases from 1 to 1.8, the plasmon resonant fields at the Au tip gradually squeeze into four bright points with the maximum field enhancement max($\beta_{Au}$) reaching 300, as indicated at 201 in FIG. 25 and also in FIG. 27. This can be explained by the effect of the plasmon field confinement; in particular, the total internal reflection within the dielectric coating from the surrounding dielectric-vacuum interface back onto the Au surface. The phenomenon occurs if the angle of incidence is greater than the critical angle $\theta_c=\sin^{-1}(1/n)$, for example, n=1.3, $\theta_c=50°$; n=1.8, $\theta_c=33°$. In other words, with increased n of dielectric coating, more total internal reflections occur within the dielectric coating (as long as $\theta>\theta_c$) and therefore the plasmonic fields can be better confined close to the Au surface. The increase in the plasmon resonant fields at distal end corners, thus, n, can be seen by comparing the lesser point 205 from FIG. 29 to that of FIG. 25, intermediate point 203 from FIG. 28 to that of FIG. 25, and greatest point 201 from FIG. 27 to that of FIG. 25.

Figure 26:
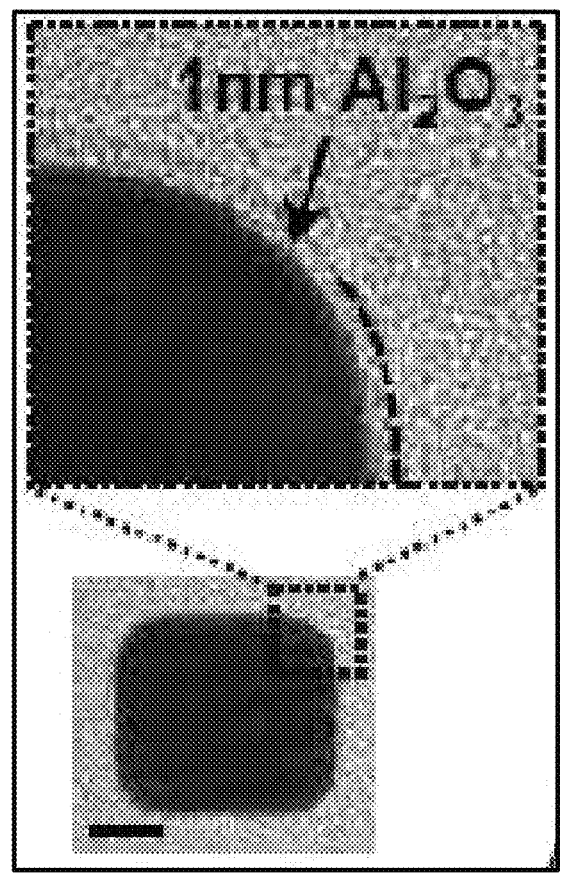
FIG. 26 is a top elevational microphotograph, with a corner enlarged, showing the present coated photoemitter.
Figure 30:
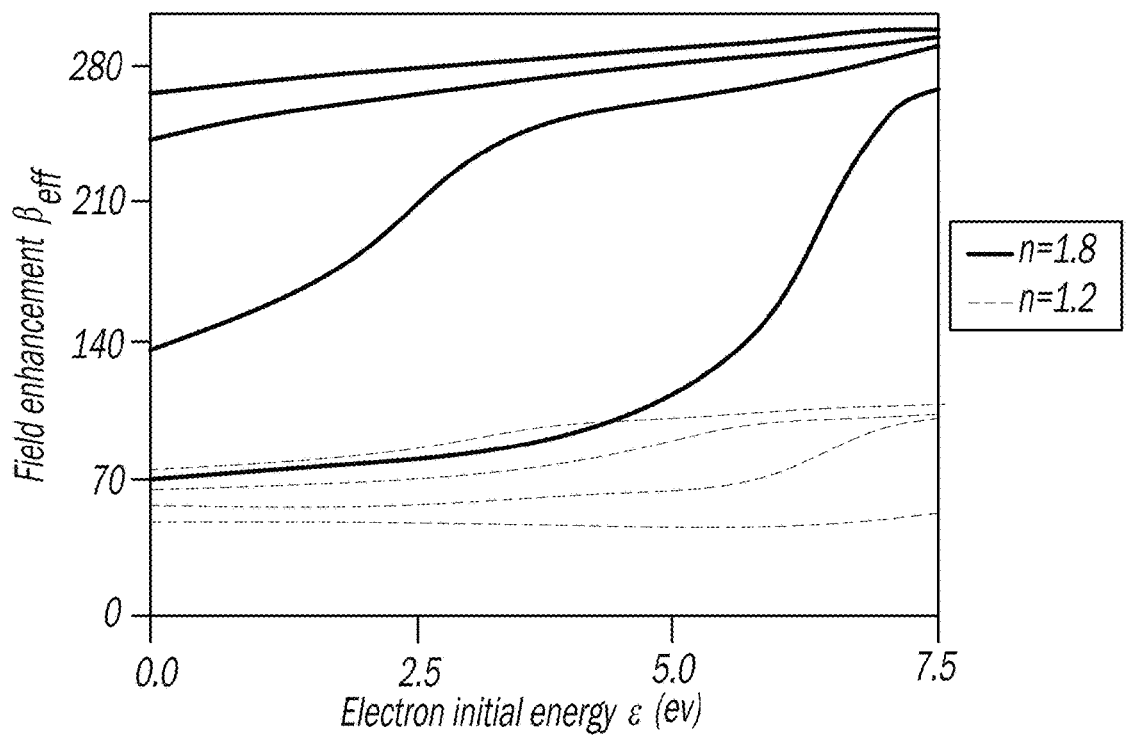
FIGS. 30 and 31 are graphs showing the effect of the refractive indices on the effective field enhancement, or on resulting photoemission current density, for the present coated photoemitter.
Figure 31:
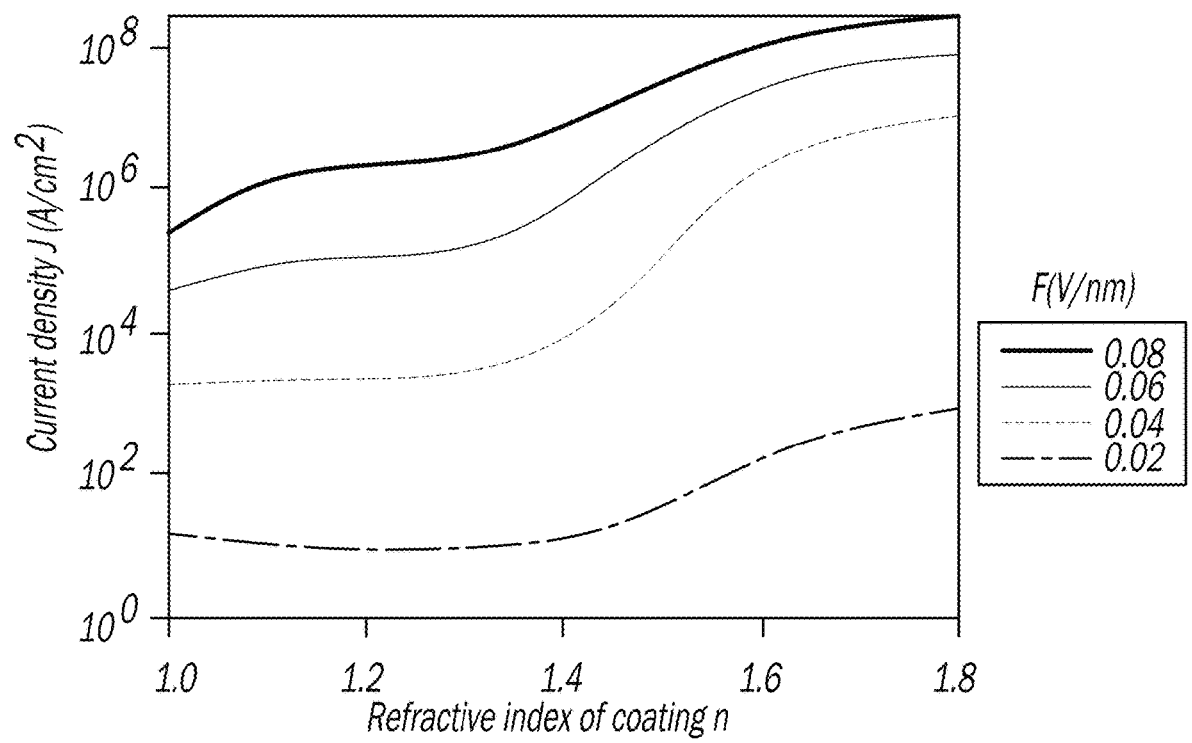
Figure 32:
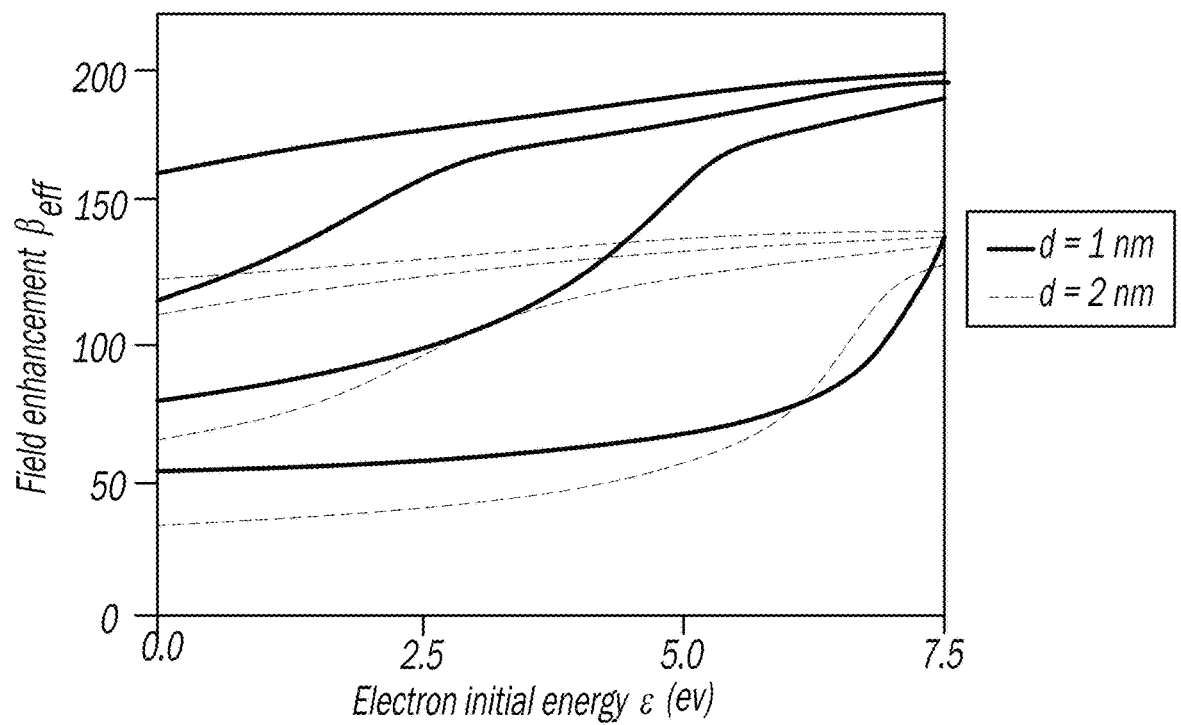
FIGS. 32 and 33 are graphs showing the effect of the coating thickness on the effective filed enhancement, or on resulting photoemission current density, for the present coated photoemitter.
Figure 33:
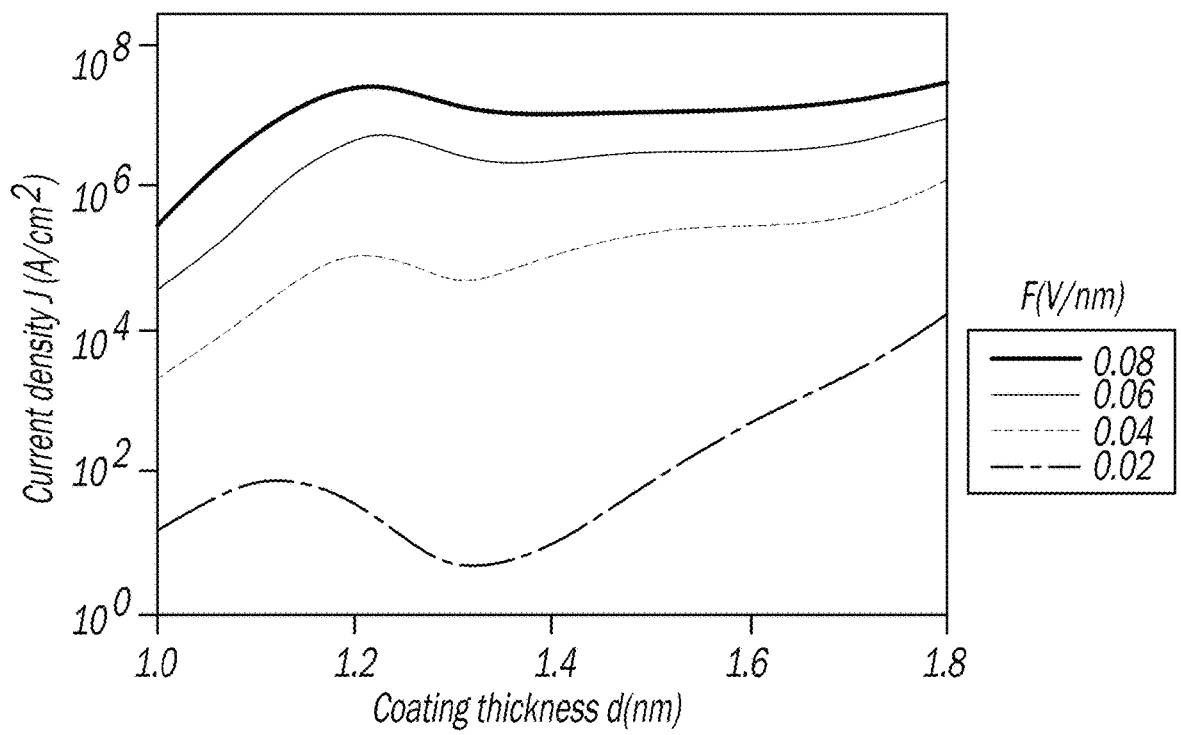

FIG. 26 is a high-resolution transmission electron microscopy image of an Au nanoparticle coated with 1 nm-thick $Al_2O_3$ layer (n=1.7) via atomic layer deposition. Moreover, FIGS. 30 and 31 show expected effects of the index n on the effective field enhancement $\beta_{eff}(\epsilon)$ (FIG. 30) and the resulting photoemission current density J (FIG. 31), with fixed d=1 nm and varied laser field strengths F. Furthermore, FIGS. 32 and 33 illustrate the expected effect of the coating thickness d on $\beta_{eff}(\epsilon)$ (FIG. 32) and J (FIG. 33), with fixed n=1.5 and varied F. In all calculations, $\chi=1$ eV, except $\chi=0$ if n=1 (bare).

Taking this field enhancement into the potential barrier, the effective field enhancement factor $\beta_{eff}$ is obtained near the corners of the emitter tip and the corresponding emission current density J. In general, both $\beta_{eff}$ and J increases as n increases, for a given incident laser field F. When the refractive index is small (n<1.3), $\beta_{eff}$ is relatively small and changes only slightly with different initial energies E; thus the emission current density is insensitive to the refractive index. However, when n becomes larger (n>1.3), $\beta_{eff}$ increases strongly as the initial electron energy $\epsilon$ gets closer to the Fermi level ($E_F=5.53$ eV), resulting in a significant increase in the emission current density.

Similarly, the effect of coating thickness d from 0.5 nm to 4 nm can be observed in FIGS. 32 and 33, with a reference point set at d=0 representing the bare emitter. Optical simulations suggest that the field enhancement $\beta_{Au}$ increases as d increases, reaches a maximum around d=1 nm, and remains roughly a constant for d=1.5-4 nm. The same trend is reflected in the emission current density J as a function of d. This is consistent with the behavior of $\beta_{eff}$, which shows a reduced dependence on $\epsilon$ when d>1 nm. Here, the coating thicknesses of 0.5-4 nm is comparable to the spill-out distance of the electron wave-function of the metal characterized by the Feibelman parameter in quantum plasmonics, which is in the angstrom range. The shift of the induced surface charges with respect to the geometrical boundaries of the metal leads to an 'effective' metal-dielectric interface inside the dielectric layer, making the 'effective' dielectric coating thinner.

Figure 34:
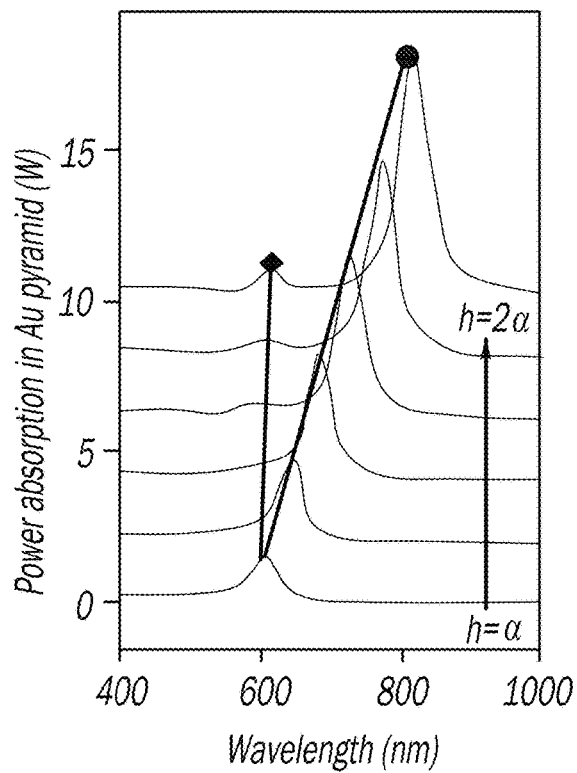
FIG. 34 is a graph showing tunable photoemissions of power absorption versus wavelength, for the present coated photoemitter.
Figure 35:
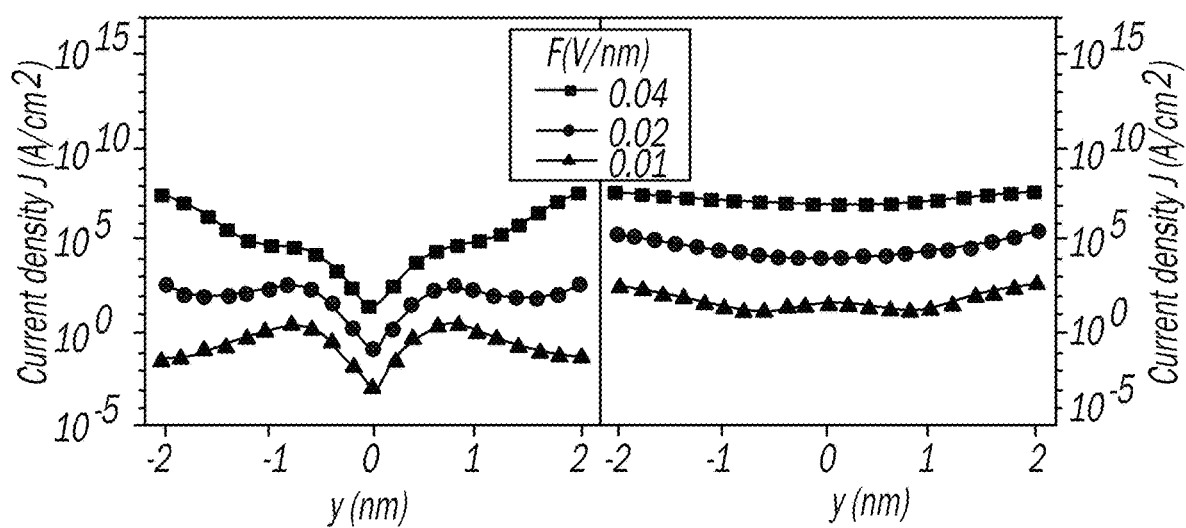
FIG. 35 shows graphs of current density for different wavelengths using a 620 nm laser (left) and 820 nm laser (right), for the present coated photoemitter.

Tunable photoemission is next considered with regard to the geometric settings of the Au nanopyramid emitter, including a, κ and h, to ascertain tunability of the emission process. It is expected that h is the most influential parameter to tune the resonance of the antenna mode, due to the perpendicular incident field along the height direction. In FIG. 34, when h is varied from a to 2a (a=40 nm), the original single optical resonance at 608 nm gradually evolves into two peaks: mode A at 620 nm and mode B at 820 nm, respectively. Their optical near-field enhancement profile β (y, z) is plotted in FIGS. 8 and 9. When this profile is taken into the photoemission model in Equations (1)-(3), different emission current density profiles are observed along the top surface of Au tip as shown in FIG. 35, under the excitation of different lasers: 620 nm (left graph) and 820 nm (right graph).

Figure 8:
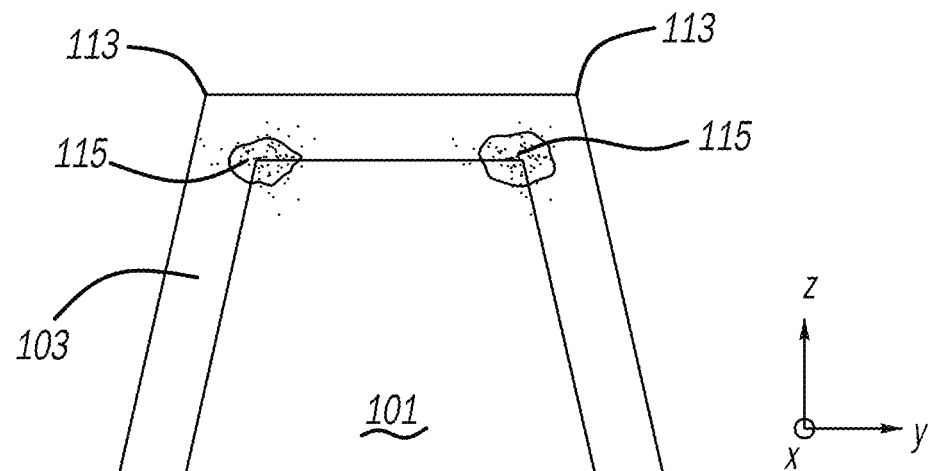
FIG. 8 is an enlarged diagrammatic side view showing local optical field values for 620 nm laser excitation, using the present coated photoemitter.
Figure 9:
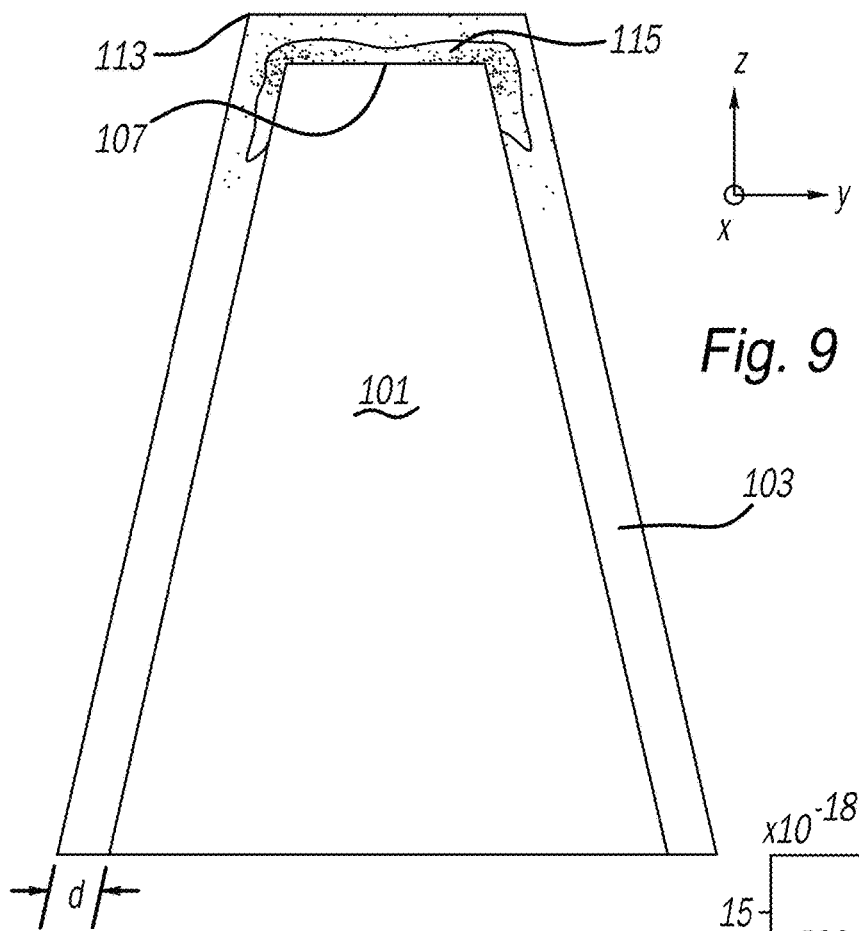
FIG. 9 is an enlarged diagrammatic side view showing local optical field values for 820 nm laser excitation, using the present coated photoemitter.

This depicts tunable photoemission. More specifically, FIG. 34 shows tunable plasmon resonances by varying the height h of the Au-nanopyramid, with other parameters unchanged: a=40 nm, κ=0.1, d=1 nm, n=1.5, and χ=1 eV. For a particular coated emitter with h=80 nm: FIGS. 8 and 9 illustrate optical field profiles for 620 nm and 820 nm modes, respectively, near the apex of the emitter (cross-sectional view in yz-plane); and FIG. 35 shows photoemission current density J along the y-axis at the Au top surface under the illumination of lasers at two different wavelengths: 620 nm and 820 nm, respectively.

The present apparatus and method employs an analytical quantum model for laser-driven photoemission from cathodes coated with nano-thick dielectric by solving the time-dependent Schrödinger equation ("TDSE"). The model is applicable to photoemission for arbitrary combinations of metal properties (i.e., workfunction and Fermi level), dielectric properties (i.e., thickness, relative permittivity, and electron affinity), laser (i.e., wavelength, and field strength or intensity), and dc field. Based on the analytical solution, the effects of dielectric properties on photoemission are analyzed. The emission current calculated from this analytical model is compared with the effective single-triangular barrier model and modified Fowler-Nordheim equation for photoemission from metal surfaces with ultrathin dielectric coatings.

Figure 36:
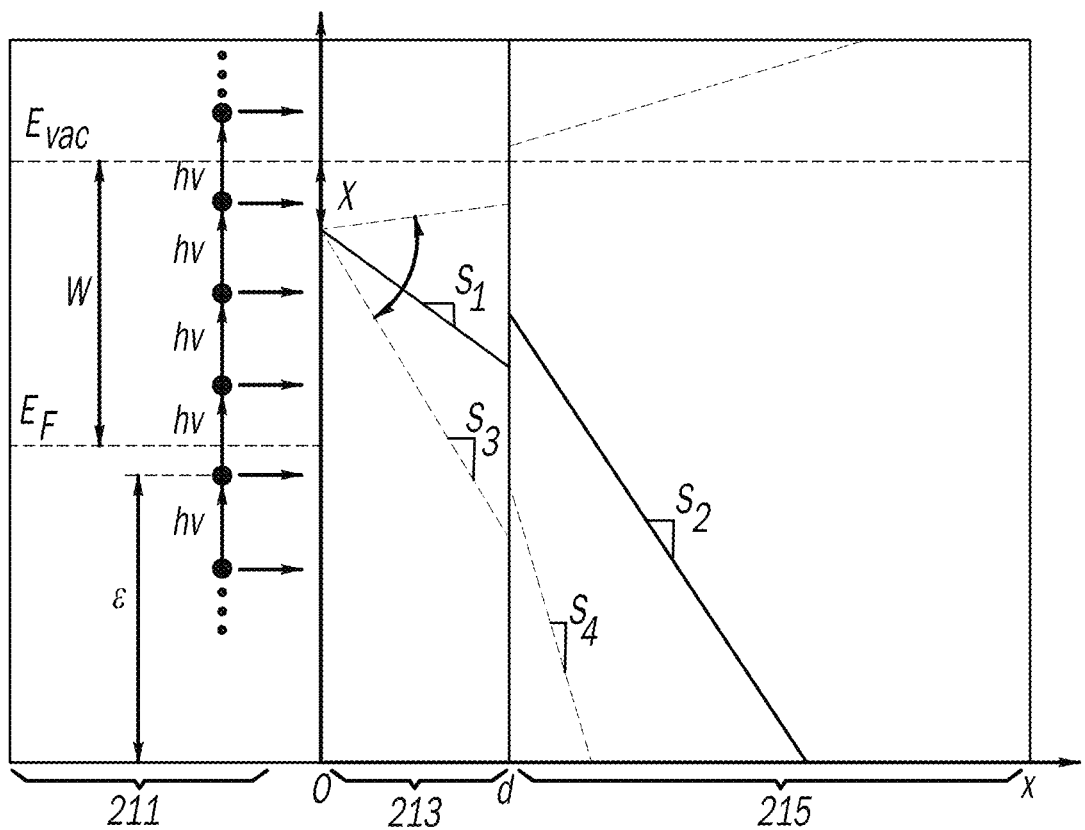
FIG. 36 is a graph showing photoemission from a flat metal surface coated with a dielectric coating of the present photoemitter, under laser electric field and dc bias.

FIG. 36 illustrates the energy diagram for photoemission from a flat metal surface coated with a dielectric under laser electric field and dc bias. The metal-dielectric interface is located at x=0, and the coating's thickness is d. The metal has Fermi energy $E_F$ and work function of W. The dielectric has the electron affinity of χ and the relative permittivity of $\epsilon_{diel}$. The laser field strengths are $F_1$ in the vacuum and $F_1^{diel}$ in the coating. The dc field strengths are $F_0$ in the vacuum and $F_0^{diel}$ in the coating. The electron incident longitudinal energy is $\epsilon$. Slopes of the potential profile, denoted as $S_1$, $S_2$, $S_3$, and $S_4$, are $-eF_0^{diel}$, $-eF_0$, $-e(F_0^{diel}+F_1^{diel})$, and $-e(F_0+F_1)$, respectively. A metal zone is denoted as 211, a dielectric zone is 213 and a vacuum zone is marked as 215 in the graph.

In the one-dimensional (1D) model, electrons with initial longitudinal energy $\epsilon$ are emitted from the flat metal surface coated with a nano-thick dielectric, driven by a laser field and a dc bias. The laser field is perpendicular to the metal surface. For simplicity, the scattering effects of photo-excited electrons with phonons or other electrons in the metal and dielectric, the charge trapping effect in the dielectric, and the image charge effect, are ignored. Therefore, the time-varying potential barrier in three regions, i.e., metal, dielectric, and vacuum, reads, $$\phi(x, t) = \begin{cases} 0, & x < 0 \\ V_0 - \chi - eF_0^{diel} x = eF_1^{diel} x \cos\omega t, & 0 \leq x < d \\ V_0 + ed(F_0 - F_0^{diel}) + ed(F_1 - F_1^{diel})\cos\omega t - \\ \quad eF_0 x - eF_1 x \cos\omega t, & x \geq d \end{cases} \quad (4)$$

where $V_0 = W + E_F$, with W and $E_F$ the work function and Fermi energy of the metal; χ is the electron affinity of the dielectric; e is the positive elementary charge; $F_0$ is the dc electric field in the vacuum; $F_0^{diel} = F_0/\epsilon_{diel}$ is the dc electric field inside the dielectric with $\epsilon_{diel}$ the relative permittivity of the dielectric; $F_1$ and $F_1^{diel} = F_1/\epsilon_{diel}$ are the laser field strengths in the vacuum and in the dielectric, respectively; ω is the angular frequency of the laser field; and d is the thickness of the dielectric.

The electron wave functions ψ(x, t) in the metal, dielectric, and vacuum are obtained by solving the time-dependent Schrödinger equation, $$i\hbar \frac{\partial \psi(x, t)}{\partial t} = -\frac{\hbar^2}{2m} \frac{\partial^2 \psi(x, t)}{\partial x^2} + \phi(x, t)\psi(x, t) \quad (5)$$

where ℏ is the reduced Planck's constant; m is the electron effective mass, with m being the electron rest mass in all three regions for simplicity; and φ(x, t) is the potential given in Equation (4).

The electron transmission probability, $w(\epsilon, x, t) = J_3(\epsilon, x, t)/J_i(\epsilon)$, is defined as the ratio of transmitted electron probability current density in the vacuum $J_3$ to the incident electron probability current density in the metal $J_i$, where $j = i\hbar/2\, m(\psi\nabla\psi^* - \psi^*\nabla\psi)$ is the electron probability current density. It is easy to show the time-averaged transmission probability as $$D(\varepsilon) = \sum_{n=-\infty}^{\infty} w_n(\varepsilon), \quad (6a)$$

$$w_n(\varepsilon) = \frac{1}{k_0} \text{Im}\left[i\sqrt{\frac{2m}{\hbar^2} E_{3n}} |T_{3n}|^2\right], \text{ for } F_0 = 0, \text{ or}$$

$$D(\varepsilon) = \sum_{n=-\infty}^{\infty} w_n(\varepsilon), \quad (6b)$$

$$w_n(\varepsilon) = \frac{|T_{3n}|^2}{k_0} \text{Im}\left[\frac{i\kappa_3}{\pi}\right], \text{ for } F_0 \neq 0,$$

with $$k_0 = \sqrt{\frac{2m\varepsilon}{\hbar^2}}; E_{3n} = \varepsilon + n\hbar\omega - U_{p3} - V_{30}$$

is the drift kinetic energy in the vacuum, with the ponderomotive energy $$U_{p3} = \frac{e^2 F_1^2}{4m\omega^2} \text{ and } V_{30} = W + E_F + ed(F_0 - F_0^{diel}) \text{ for}$$

$$F_0 \neq 0 \text{ or } V_{30} = W + E_F \text{ for } F_0 = 0; \text{ and } \kappa_3 = \left(\frac{2meF_0}{\hbar^2}\right)^{1/3};$$

$T_{3n}$ is the transmission coefficient of the wave in the vacuum.

The electron emission current density is obtained from $$J = e\int_0^\infty D(\epsilon)N(\epsilon)d\epsilon, \qquad (7)$$

where $D(\epsilon)$ is given in Equation (6) and $$N(\varepsilon) = \frac{mk_B T}{2\pi^2 \hbar^3}\ln\left[1 + \exp\left(\frac{E_F - \varepsilon}{k_B T}\right)\right]$$

is the flux of electrons impinging normal to the metal-dielectric interface, which is calculated from the free electron theory of metal, with $k_B$ the Boltzmann's constant and T the temperature.

An analysis of the photoemission from metallic cathodes coated with dielectric is conducted based on the theory developed above. The metal is assumed to be gold, with work function W=5.1 eV and Fermi energy $E_F$=5.53 eV. The laser has a wavelength of 800 nm, corresponding to the photon energy of 1.55 eV. These would be the default properties of the metal and laser respectively, unless prescribed otherwise.

Figure 37:
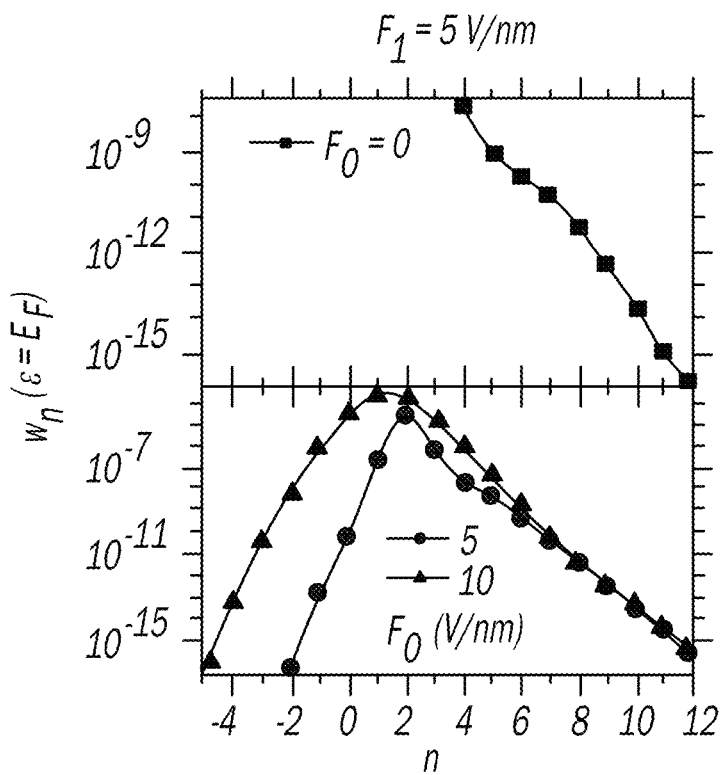
FIG. 37 shows graphs of effects of dc field on photoemission from dielectric coated metal surfaces of the present photoemitter.
Figure 38:
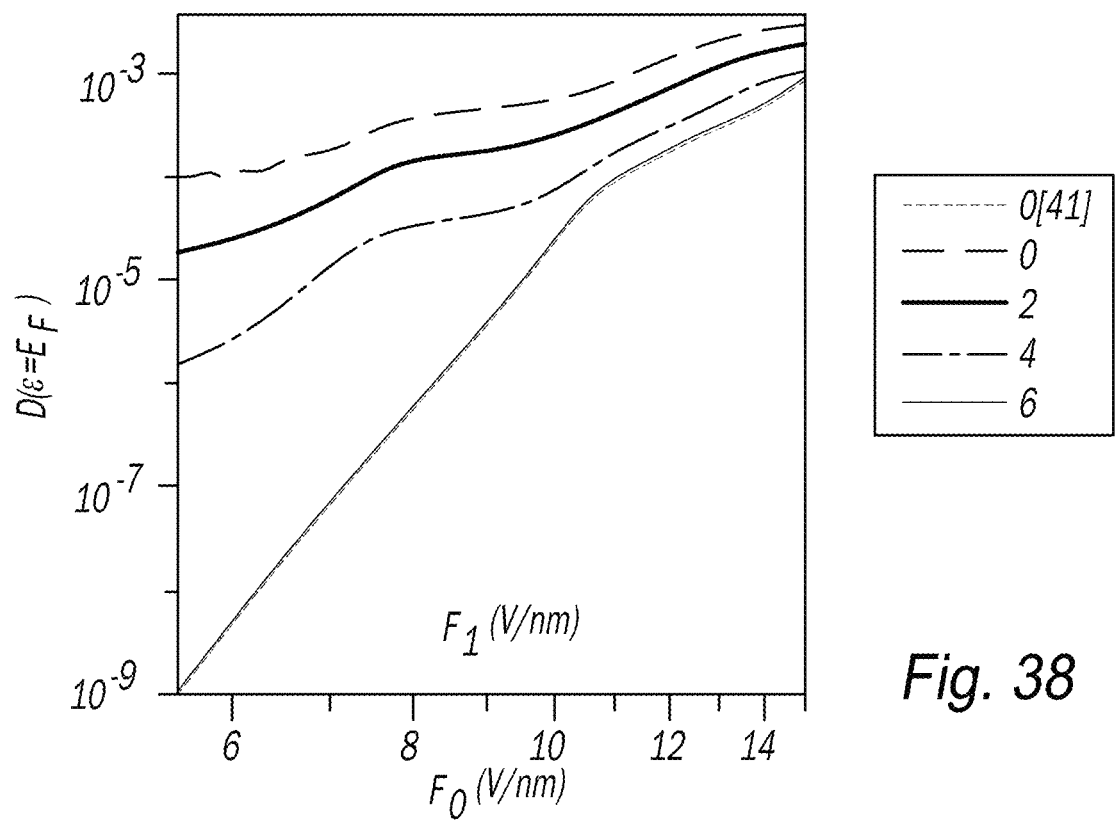
FIG. 38 is a graph of electron transmission probability as a function of local dc field under various local laser field strengths, for the present coated photoemitter.
Figure 39:
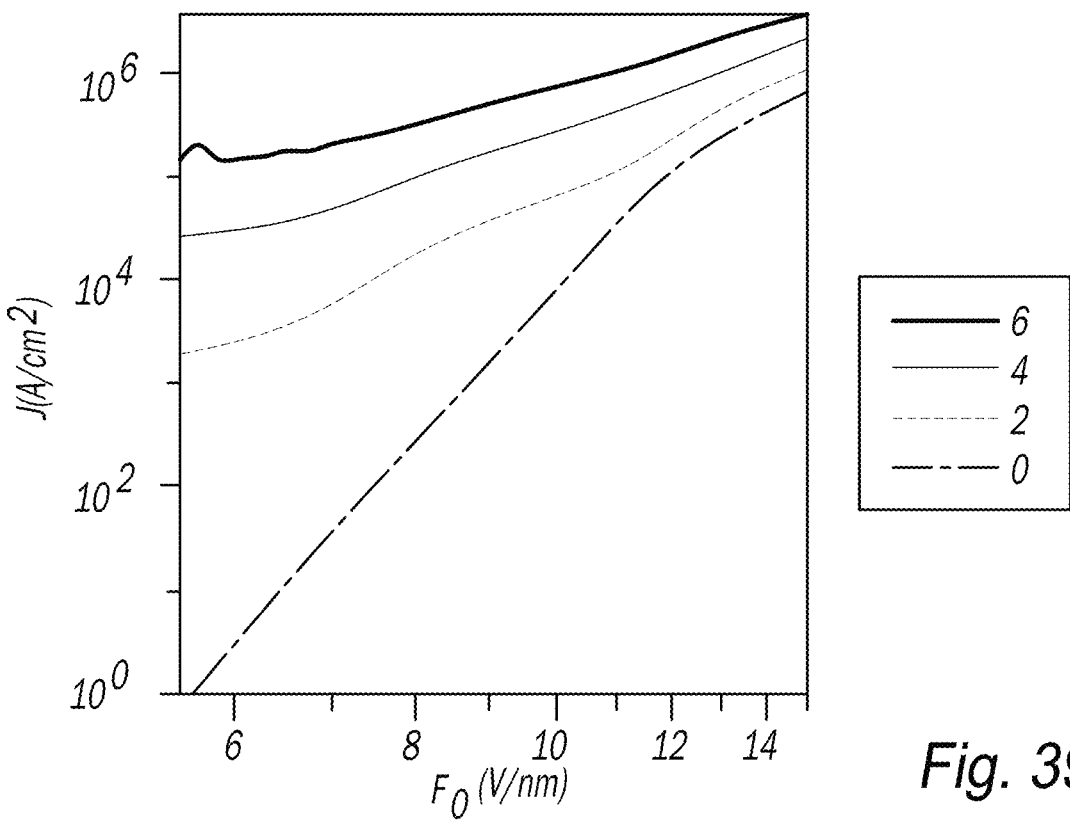
FIG. 39 is a graph of local electron emission current density as a function of local dc field under various local laser field strengths, for the present coated photoemitter.

FIGS. 37-39 show the expected effects of a dc electric field on the photoemission from dielectric-coated metal surfaces. It is observed that the dominant emission channel shifts to smaller n as $F_0$ increases, in FIG. 37 for the electron emission energy spectrum. The lowered surface potential barrier by the static field enables such photoemission mechanisms as photo-assisted photoemission and direct tunneling beyond above-threshold multiphoton absorption. Meanwhile, the electron transmission probability is also greatly enhanced.

FIG. 39 shows the expected emission current density as a function of dc field strength under various laser field strengths. The emission current density shares similar shape with the transmission probability from $\epsilon=E_F$ in FIG. 38, since most of the emission occurs with initial energy ~1 eV below the Fermi level at ambient temperature. For $F_0 \lesssim 12$ V/nm, the slope of the curves varies with the laser field strength in the vacuum $F_1$, which indicates that n-photon assisted field tunneling dominates in this range. When $F_0 \gtrsim 12$ V/nm, the slopes of the curves for all four cases are the same due to the dominant static field tunneling.

Accordingly, the effects of dc field on photoemission from dielectric-coated metal surfaces can be observed. FIG. 37 shows photoemission electron energy spectrum under various dc fields with the laser field strength $F_1$=5 V/nm. Moreover, FIG. 39 illustrates electron emission current density J as a function of dc field $F_0$ under various laser field strengths. The coating has $\epsilon_{diel}$=2, $\chi$=1 eV, and d=1 nm.

A pyramid-shaped photoemitter coated with an atomically thick dielectric has been numerically demonstrated to provide an emission current of orders of magnitude larger than bare emitter. The substantially improved photoemission is ascribed to the secondary field enhancement by confining the plasmonic field inside the dielectric waveguide along the metal surface. Full wave optical simulation exemplifies an approximately linearly decaying laser field inside the dielectric at the resonance wavelength of 608 nm, with the maximum field enhancement factor at the metal-dielectric interface.

Figure 40:
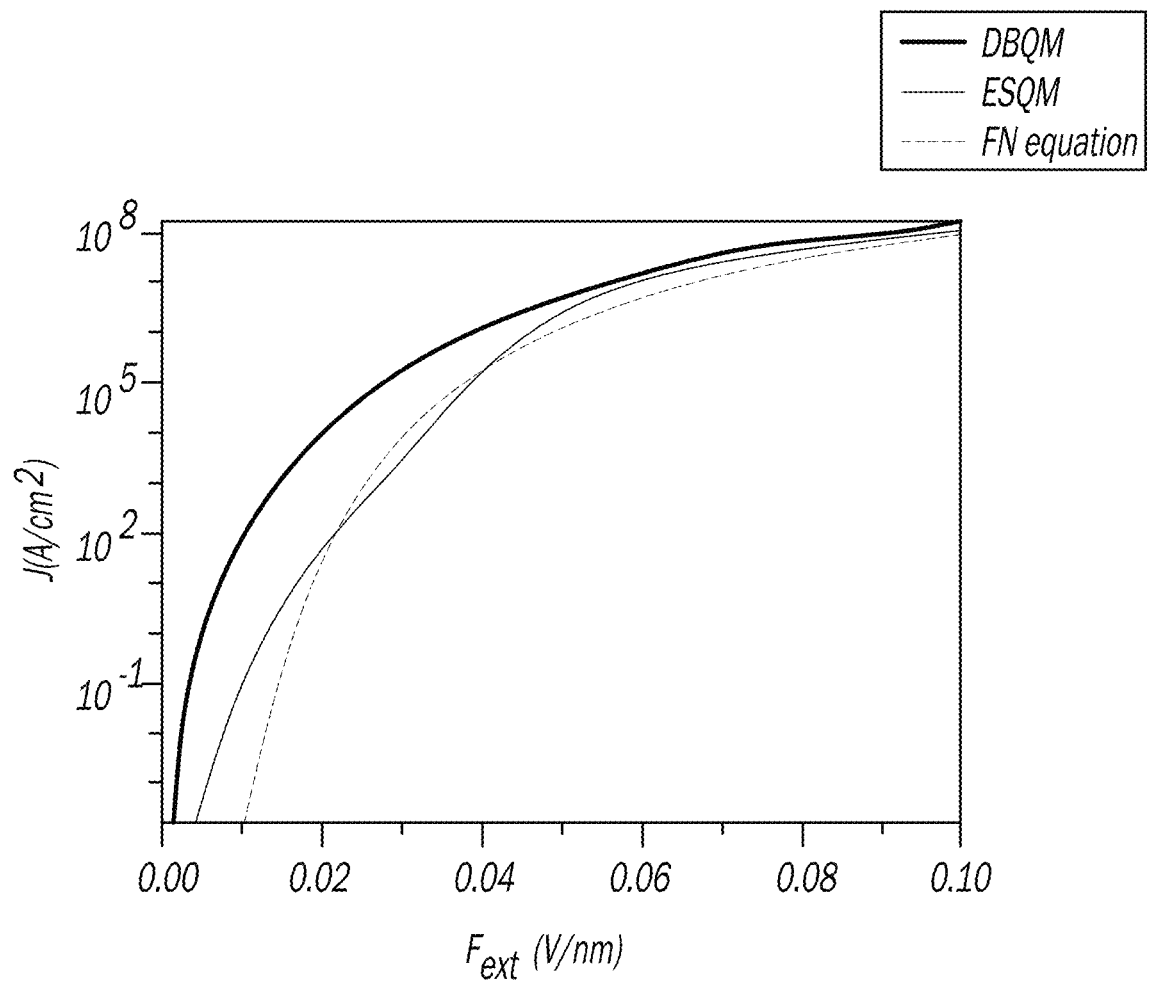
FIG. 40 is a graph showing photoemission current density as a function of laser field strengths, for the present coated photoemitter, using different models.

FIG. 40 presents the emission current density J, calculated from the double barrier quantum model (DBQM, Equations 6 and 7), effective single-barrier quantum model (ESQM), and modified Fowler-Nordheim (FN) equation for the photoemission from the pyramid-shaped gold emitter with $SiO_2$ coatings, as a function of the externally applied laser field strength $F_{ext}$. To accommodate to the double triangular barrier quantum model and the modified Fowler-Nordheim equation, the laser field inside the coating is assumed uniform, with the field strength being the one at metal-dielectric interface, and the laser field in the vacuum is assumed to be the one at dielectric-vacuum interface. Those three models manifest quantitatively good agreement for $F_{ext}$>0.05 V/nm, where the emission probably enters strong field tunneling regime. For 0.01<$F_{ext}$<0.05 V/nm, the emission current densities calculated from ESQM and FN equation are smaller than that calculated from DBQM, with difference ranging from a few times to several orders. It is undeniable that the assumption of the laser field inside the coating being the maximum at metal-dielectric interface would result in an overestimate of the emission current. The other calculation for DBQM (not shown), with the laser field inside the coating determined by the slope of the line connecting the potential barrier at two interfaces, shows that emission current densities from ESQM and FN equation are still smaller for $F_{ext}$<0.03 V/nm. Such an approximation of field inside the dielectric underestimates the photoemission current, especially when the externally applied field $F_{ext}$ is relatively small. Therefore, the emission current density from Au photoemitter with coatings is undervalued by the effective single-barrier quantum model for $F_{ext}$<0.03 V/nm. The photoemission from the coated photoemitter is greatly enhanced throughout the field shown compared with the bare emitter. This figure illustrates a photoemission current density J, calculated from double barrier quantum model (DBQM), effective single-barrier quantum model (ESQM), and modified Fowler-Nordheim equation (FN equation), as a function of externally applied laser field strength $F_{ext}$ for pyramid-shaped photoemitters with $SiO_2$ coatings.

In summary, a metal surface coated with dielectric tends to induce a current larger than the bare metal due to the lowered field inside the dielectric. The photoemission can be enhanced by reducing the relative permittivity and increasing the electron affinity of the dielectric. Furthermore, the pyramid-shaped nano-emitter coated with dielectric has demonstrated its greatly enhanced photoemission compared with the bare emitter, due to the secondary field enhancement beyond plasmonic field enhancement. The photoemission is also enhanced in the relatively small laser field range. Therefore, the present coated photoemitters are beneficially expected to provide higher yield, longer lifetime and more stable electron sources.

The foregoing description of the embodiments has been provided for purposes of illustration and description, however, variations thereof are envisioned. For example, other polygonal or curved coated photoemitter peripheral shapes may be employed, although certain advantages may not be realized. Moreover, the presently coated photoemitters can be employed in other end-use applications, however, some of the present benefits may not be achieved. Individual elements or features of a particular embodiment are generally not limited to that particular embodiment, but, where applicable, are interchangeable and can be used in a selected embodiment, even if not specifically shown or described, and all of the dependent claims may be multiply dependent in any combination. Such variations are not to be regarded as a departure from the present disclosure, and all such modifications are intended to be included within the scope and spirit of the present disclosure.

The invention claimed is:

1. A photonic apparatus comprising:
a conductive photoemitter comprising a core with a proximal end connected to the substrate, and an opposite distal end that has a narrow width as compared to the proximal end, with a tapering side wall between the ends, a height dimension between the ends being at least twice that of the width of the distal end;
the photoemitter further comprising a dielectric material coating the distal end and side walls of the core, the dielectric material having a thickness of 0.1-4.5 nm, and the dielectric material being configured to enhance a local optical field strength and current density of the photoemitter as compared to a core without the dielectric layer;
a conductive substrate being laterally greater in size than the photoemitter, the proximal end of the photoemitter being connected to the substrate;
a laser beam received by the photoemitter;
the photoemitter being configured to transmit electron photoemissions therefrom in response to the laser beam; and
the photoemitter having a truncated pyramidal shape configured to concentrate the electron photoemissions at multiple proximal end corners thereof.

2. The photonic apparatus of claim 1, further comprising a first laser emitting the laser beam having a first wavelength and at least a second laser emitting the laser beam having a second and different wavelength, and the dielectric material coated photoemitter being tunable to transmit the photoemissions with different photonic characteristics depending on when the first laser or the second laser is used.

3. The photonic apparatus of claim 2, wherein the laser beam comprises laser beam pulses each having a duration of less than 100 fs.

4. The photonic apparatus of claim 1, wherein the core is gold material and the dielectric material is $SiO_2$.

5. The photonic apparatus of claim 1, wherein the core is one of: gold or doped silicon, and the dielectric material is one of: ceramic, $Al_2O_3$, or $SiO_2$.

6. The photonic apparatus of claim 1, wherein the core and the substrate are the same material, and the dielectric material is a different material than the core and the substrate.

7. A photonic apparatus comprising:
a photoemitter including a metallic core having a corner;
a dielectric layer on the core, being configured to enhance a local optical field of the photoemitter; and
the photoemitter being configured to transmit photoemissions therefrom in response to laser beam contact with the photoemitter.

8. The photonic apparatus of claim 7, further comprising a conductive substrate of larger lateral size than a lateral size of a proximal end of the photoemitter, a distal end of the photoemitter outwardly projecting from the substrate with at least one corner thereon, and a height dimension between the ends being at least twice that of a lateral size of the distal end.

9. The photonic apparatus of claim 8, wherein the distal end includes at least two corners where the dielectric layer concentrates strong photoemission current.

10. The photonic apparatus of claim 8, wherein the distal end includes four corners where the dielectric layer concentrates strong photoemission current, and side walls between the ends of the photoemitter are tapered.

11. The photonic apparatus of claim 7, further comprising a substrate, the metallic core including a proximal end connected to the substrate, and an opposite distal end having a narrow width as compared to the proximal end, with a tapering side wall extending between the ends.

12. The photonic apparatus of claim 7, further comprising a laterally enlarged substrate with multiples of the dielectric layered photoemitter mounted on a surface thereof, the photoemitters each including at least four corners which point in directions parallel to a plane along the surface of the substrate, and a largest dimension between the corners of each of the photoemitters being greater than a thickness dimension of the associated photoemitter, the thickness dimension being perpendicular to the plane.

13. The photonic apparatus of claim 7, further comprising an electron microscope comprising a laser, the dielectric layered photoemitter, a specimen being imaged with the photoemissions from the photoemitter, and an image detector.

14. The photonic apparatus of claim 7, further comprising a particle accelerator comprising a laser, the dielectric layered photoemitter, and radio frequency cavities aligned with the dielectric layered photoemitter.

15. The photonic apparatus of claim 7, further comprising a traveling wave tube comprising a laser, the dielectric layered photoemitter, a vacuum tube, an RF signal input, an RF signal output spaced away from the input, and an electron collector spaced away from the dielectric layered photoemitter.

16. The photonic apparatus of claim 7, wherein the dielectric layer has a thickness of 0.1-4.5 nm, the dielectric layer is one of: ceramic, $Al_2O_3$, or $SiO_2$, and the core is different than the dielectric layer.

17. A photonic apparatus comprising:
a photoemitter having a distal corner and a tapered shape;
a dielectric layer on a core of the photoemitter, the dielectric layer being configured to enhance a local optical field of the photoemitter; and
a first laser operably emitting a first wavelength pulse;
at least a second laser emitting a second and different wavelength pulse;
the dielectric layered photoemitter being tunable to transmit photoemissions from the corner thereof with different photonic characteristics depending on the wavelength pulse received; and
the laser beam pulses each having a duration of less than 100 fs.

18. The photonic apparatus of claim 17, further comprising a proximal end of the core being mounted on a laterally enlarged and flat substrate, wherein the dielectric layer has a thickness of 0.1-4.5 nm, and there are multiple photoemitting corners on the photoemitter.

19. The photonic apparatus of claim 17, wherein the dielectric layer is one of: ceramic, $Al_2O_3$, or $SiO_2$, and the core is a different material than the dielectric layer.

20. The photonic apparatus of claim 17, wherein the photoemitter has a polygonal shape of: (a) a truncated pyramid, (b) a star, (c) a rectangle, or (d) a diamond.

* * * * *